(12) United States Patent
Yamazaki et al.

(10) Patent No.: US 7,915,611 B2
(45) Date of Patent: Mar. 29, 2011

(54) PHOTOELECTRIC CONVERSION DEVICE

(75) Inventors: Shunpei Yamazaki, Tokyo (JP);
Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 246 days.

(21) Appl. No.: 12/270,425

(22) Filed: Nov. 13, 2008

(65) Prior Publication Data

US 2009/0127555 A1    May 21, 2009

(30) Foreign Application Priority Data

Nov. 16, 2007   (JP) ................. 2007-298325

(51) Int. Cl.
*H01L 29/04* (2006.01)
*H01L 29/10* (2006.01)
*H01L 31/036* (2006.01)
*H01L 31/00* (2006.01)
*H02N 6/00* (2006.01)

(52) U.S. Cl. ............. 257/51; 257/E31.04; 257/E31.043; 257/E31.047; 136/243; 136/252; 136/258

(58) Field of Classification Search .............. 257/51, 257/E31.04, E31.043, E31.047; 136/243, 136/252, 258
See application file for complete search history.

(56) References Cited

U.S. PATENT DOCUMENTS

| 4,272,641 A * | 6/1981 | Hanak ............ 136/249 |
|---|---|---|
| 4,316,049 A | 2/1982 | Hanak ............ 136/244 |
| 4,496,788 A | 1/1985 | Hamakawa et al. ......... 136/249 |
| 4,680,422 A * | 7/1987 | Stanbery ........... 136/249 |
| 4,684,761 A * | 8/1987 | Devaney ........... 136/258 |
| 4,878,097 A | 10/1989 | Yamazaki ........... 257/55 |
| 4,950,614 A | 8/1990 | Yamazaki ........... 438/74 |
| 4,954,856 A | 9/1990 | Yamazaki ........... 257/458 |
| 4,971,919 A | 11/1990 | Yamazaki ........... 438/74 |
| 5,045,482 A | 9/1991 | Yamazaki ........... 438/74 |
| 5,370,747 A * | 12/1994 | Noguchi et al. ........ 136/259 |
| 5,478,777 A | 12/1995 | Yamazaki ........... 438/487 |
| 5,536,333 A * | 7/1996 | Foote et al. ........ 136/260 |
| 5,580,820 A | 12/1996 | Yamazaki ........... 438/97 |
| 5,656,098 A * | 8/1997 | Ishikawa et al. ........ 136/256 |

(Continued)

FOREIGN PATENT DOCUMENTS

JP    59-124772    7/1984

(Continued)

*Primary Examiner* — Ida M Soward
(74) *Attorney, Agent, or Firm* — Fish & Richardson P.C.

(57) ABSTRACT

In order to form a metal thin film, a silicide film, or the like between an upper-layer unit cell and a lower-layer unit cell in stacked-layer photoelectric conversion devices, a step of forming the thin film is additionally needed. Therefore, a problem such as decline in productivity of the photoelectric conversion devices occurs. A first unit cell including a single crystal semiconductor layer with a thickness of 10 μm or less as a photoelectric conversion layer and a second unit cell including a non-single-crystal semiconductor layer as a photoelectric conversion layer, which is provided over the first unit cell, are at least included, and conductive clusters are dispersed between the unit cells. The conductive clusters are located between the lower-layer unit cell and the upper-layer unit cell to form an ohmic contact; thus, current flows between the both unit cells.

14 Claims, 19 Drawing Sheets

U.S. PATENT DOCUMENTS

| | | | |
|---|---|---|---|
| 5,668,050 A * | 9/1997 | Iwasaki | 438/69 |
| 5,720,827 A * | 2/1998 | Simmons | 136/250 |
| 6,191,353 B1 * | 2/2001 | Shiotsuka et al. | 136/256 |
| 6,566,277 B1 | 5/2003 | Nakagawa et al. | 438/761 |
| 6,930,025 B2 * | 8/2005 | Nakayama et al. | 438/478 |
| 7,750,425 B2 * | 7/2010 | Forrest et al. | 257/441 |
| 2002/0197460 A1 * | 12/2002 | Kaneko et al. | 428/210 |
| 2003/0015234 A1 * | 1/2003 | Yasuno | 136/249 |

FOREIGN PATENT DOCUMENTS

| | | |
|---|---|---|
| JP | 60-240169 | 11/1985 |
| JP | 63-157483 | 6/1988 |
| JP | 10-335683 | 12/1998 |
| JP | 2000-150940 | 5/2000 |
| JP | 2001-160540 | 6/2001 |

* cited by examiner

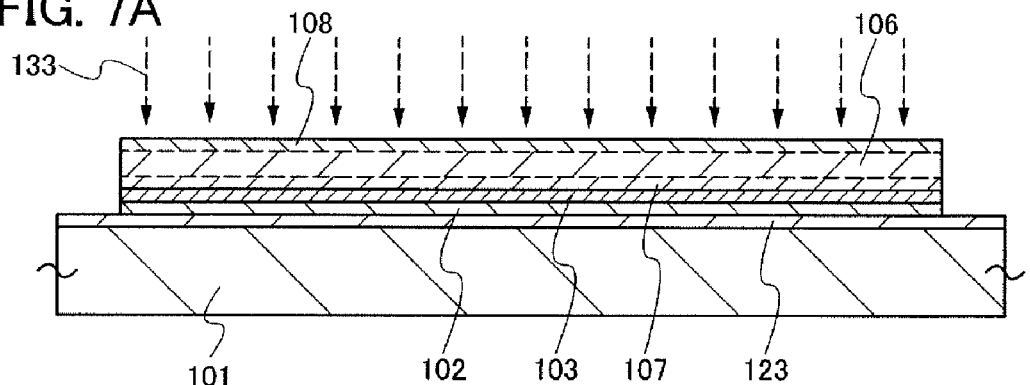
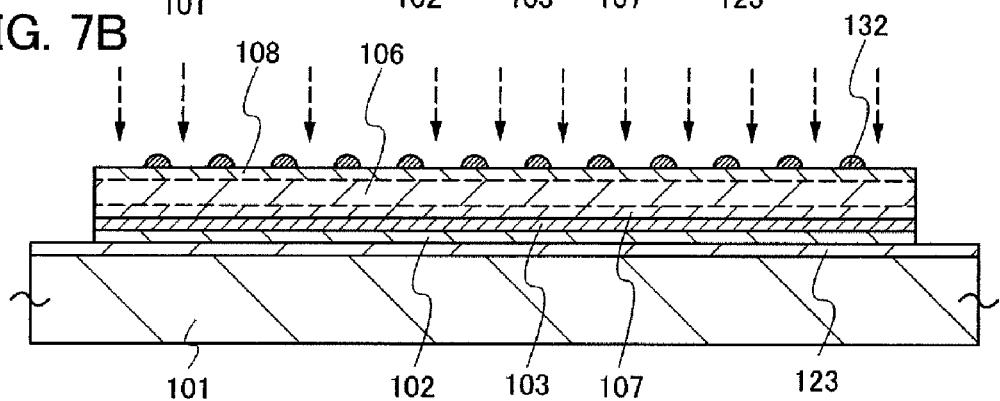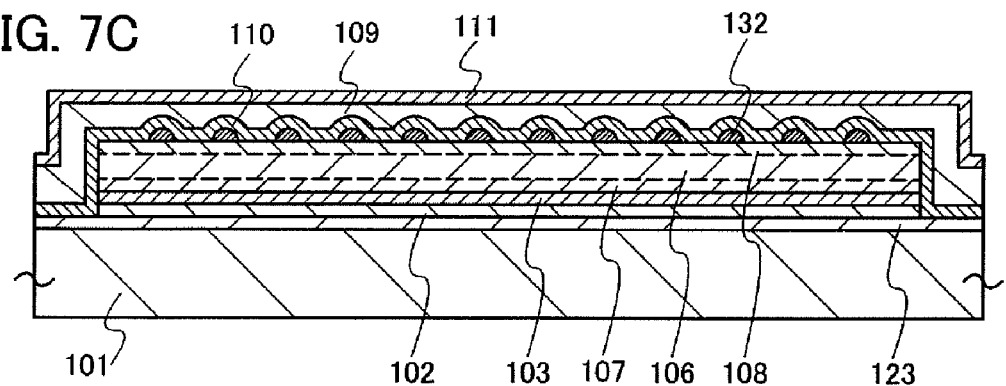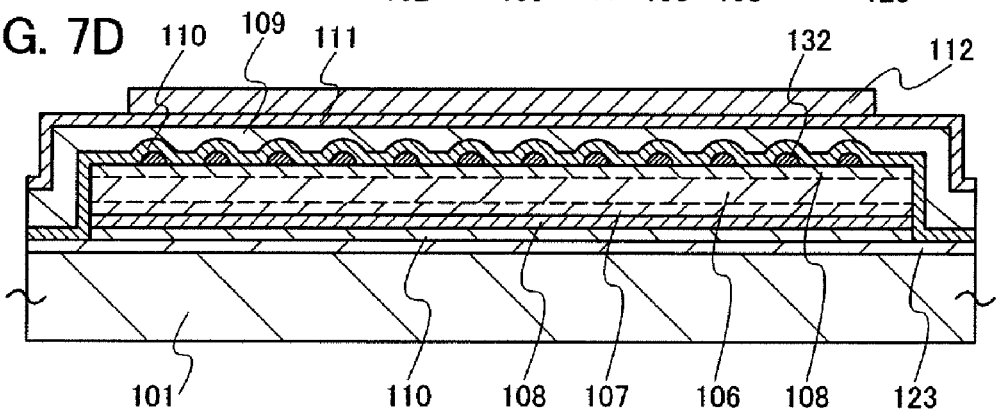

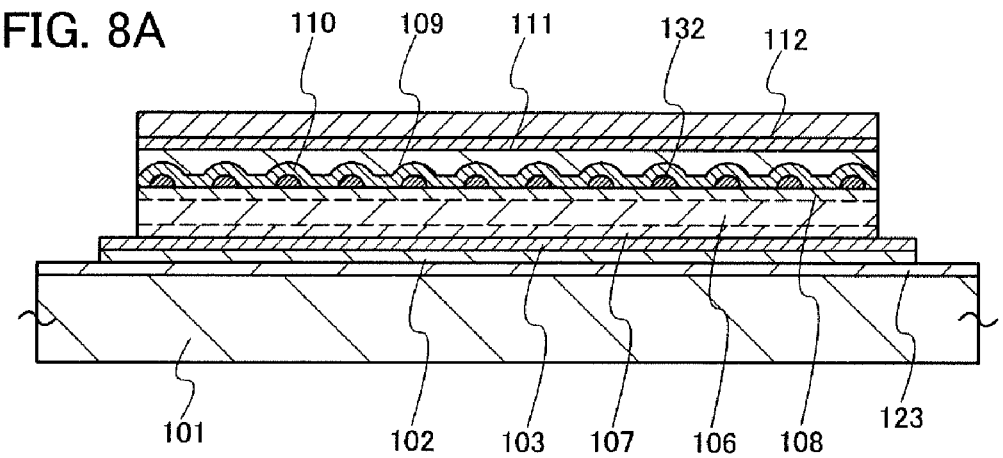
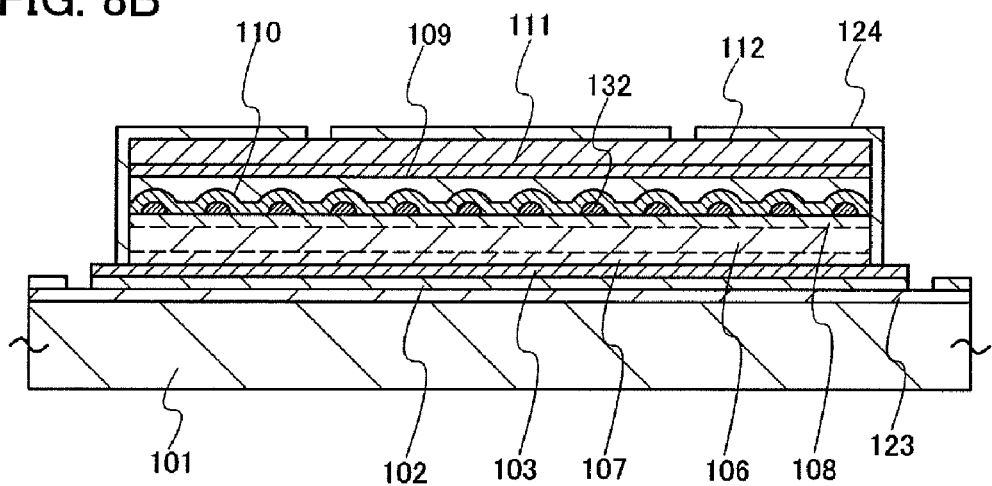
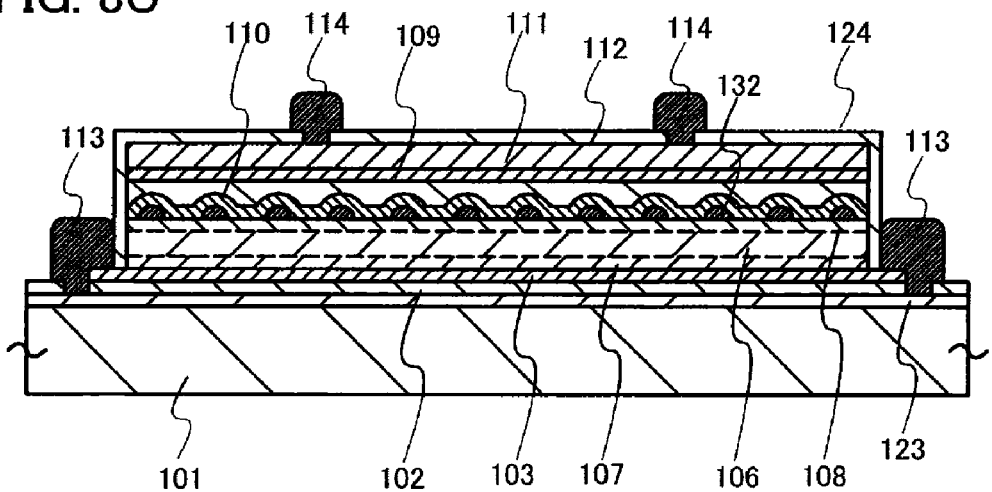

PHOTOELECTRIC CONVERSION DEVICE

BACKGROUND OF THE INVENTION

1. Field of the Invention

The present invention relates to a photoelectric conversion device in which a single crystal semiconductor or a polycrystalline semiconductor is used, and a photoelectric conversion device in which a plurality of photoelectric conversion elements are stacked.

2. Description of the Related Art

Photovoltaics is spreading as a clean and inexhaustible energy source. For photovoltaics, a photoelectric conversion device (also referred to as a "solar battery") which converts photo energy into electrical energy with use of photoelectric characteristics of a semiconductor is used.

The production of photoelectric conversion devices is increasing every year. For example, the worldwide production amount of solar batteries in 2005 is 1759 MW, which means drastic increase of 147% in comparison with the previous year. The photoelectric conversion devices using a crystal semiconductor is spreading worldwide, and photoelectric conversion devices using a single crystal silicon substrate or a polycrystalline silicon substrate account for a large part of the production amount.

As the demand for crystalline photoelectric conversion devices using silicon as a material increases, problems such as short supply of polycrystalline silicon which is a material of a silicon substrate and escalating price of polycrystalline silicon due to the short supply occur. The production amount of polycrystalline silicon in 2007 is estimated to be about 36,000 ton, and on the other hand, polycrystalline silicon of 25,000 ton or more is needed for a semiconductor (LSI) and 20,000 ton or more is needed for solar batteries; therefore, shortage of about 10,000 ton is expected. Such supply shortage is expected to continue.

The adequate thickness of a crystalline photoelectric conversion device using silicon as a material is 10 µm so that the crystalline photoelectric conversion device can absorb solar light. On the other hand, a single crystal silicon substrate or a polycrystalline silicon substrate which serves as a base material of the crystalline photoelectric conversion device has a thickness of about 200 µm to 300 µm. Thus, the photoelectric conversion device using the single crystal silicon substrate or the polycrystalline silicon substrate has a thickness which is more than 10 times as thick as the thickness needed for photoelectric conversion. Supply shortage of silicon substrates also results from inefficient use of expensive semiconductor materials by photoelectric conversion devices.

Photoelectric conversion devices have various structures. As well as photoelectric conversion devices having a typical structure in which an n-type or p-type diffusion layer is formed over a single crystal silicon substrate or a polycrystalline silicon substrate, stacked-layer photoelectric conversion devices having a structure in which different unit cells, which are a unit cell formed of a single crystal semiconductor and a unit cell formed of an amorphous semiconductor, are combined are known (e.g., see Patent Document 1: Japanese Published Patent Application No. H6-44638).

The stacked-layer photoelectric conversion devices in which a plurality of photoelectric conversion unit cells are stacked have problems in that a junction in an opposite direction to the unit cells (opposite junction) is formed at a junction portion of an upper-layer unit cell and a lower-layer unit cell and current does not flow well, and thus output characteristics of the photoelectric conversion device are decreased. As a solution of such problems, a technique is known in which a metal thin film, a silicide film, or the like is interposed to solve the opposite junction to form an ohmic contact (e.g., see Patent Document 2: Japanese Published Patent Application No. H1-47907, Patent Document 3: Japanese Published Patent Application No. H5-25187, and Patent Document 4: Japanese Published Patent Application No. H5-43306).

SUMMARY OF THE INVENTION

Since the stacked-layer photoelectric conversion devices having a structure in which the different unit cells, which are the unit cell formed of a single crystal semiconductor and the unit cell formed of an amorphous semiconductor, are combined use a thick semiconductor substrate anyway, a challenge of efficiently using a silicon semiconductor cannot be achieved.

Moreover, in order to form a metal thin film, a silicide film, or the like between the upper-layer unit cell and the lower-layer unit cell in the stacked-layer photoelectric conversion device, a step of forming the thin film is additionally needed. Therefore, a problem of decline in productivity of photoelectric conversion devices occurs.

After all, with a conventional technique, it is difficult to efficiently produce a sufficient number of photoelectric conversion devices which meet the demand by efficient use of limited materials. In view of the above-described conditions, it is an object of the present invention to provide a photoelectric conversion device which efficiently uses a silicon semiconductor material and has excellent photoelectric conversion characteristics, and a manufacturing method thereof.

The gist of the present invention is a photoelectric conversion device in which at least a first unit cell including a single crystal semiconductor layer with a thickness of 10 µm or less as a photoelectric conversion layer and a second unit cell including a non-single-crystal semiconductor layer as a photoelectric conversion layer, which is provided over the first unit cell, are included and metal clusters are dispersed between the unit cells.

One feature of the present invention is a photoelectric conversion device including a first unit cell in which a first electrode is provided over one of surfaces of a single crystal semiconductor layer with a first impurity semiconductor layer having one conductivity type interposed therebetween and a second impurity semiconductor layer having an opposite conductivity type to the one conductivity type is provided over the other surface; and a second unit cell in which a third impurity semiconductor layer having one conductivity type is provided over one of surfaces of a non-single-crystal semiconductor layer and a second electrode is provided over the other surface with a fourth impurity semiconductor layer having an opposite conductivity type to the one conductivity type interposed therebetween, where conductive clusters formed of metal, metal nitride, or metal oxide are included at a bonding interface between the second impurity semiconductor layer and the third impurity semiconductor layer, and an insulating layer is provided over a surface of the first electrode, which is on the opposite side to the single crystal semiconductor layer, to be bonded to a supporting substrate.

Another feature of the present invention is a method for manufacturing a photoelectric conversion device including the steps of forming a damaged layer by irradiation of one of surfaces of a single crystal semiconductor substrate with cluster ions to reach a depth of 10 µm or less from the surface; forming a first impurity semiconductor layer by irradiation with first impurity ions from the one surface side of the single crystal semiconductor substrate; forming a first electrode and an insulating layer over the first impurity semiconductor layer; bonding the insulating layer to a supporting substrate; cleaving the single crystal semiconductor substrate at the damaged layer, so that a single crystal semiconductor layer remains over the supporting substrate; forming a second impurity semiconductor layer by irradiation with second impurity ions from the cleavage plane side of the single crystal semiconductor layer; dispersing conductive clusters formed of metal, metal nitride, or metal oxide over the second impurity semiconductor layer; decomposing a reactive gas containing a semiconductor material gas by electromagnetic energy and sequentially stacking a third impurity semiconductor layer having one conductivity type, a non-single-crystal semiconductor layer, and a fourth semiconductor layer having an opposite conductivity type to the one conductivity type over the second impurity semiconductor layer and the conductive clusters; and forming a second electrode over the fourth impurity semiconductor layer.

Note that "single crystals" are crystals in which crystal faces and crystal axes are aligned and atoms or molecules which are included in the single crystals are aligned in a spatially ordered manner. However, although single crystals are structured by orderly aligned atoms, single crystals may include a lattice defect in which part of the alignment is disordered or single crystals may include intended or unintended lattice distortion.

A "cluster" is a structural unit including a plurality of atoms or molecules. A "conductive cluster" refers to a cluster which is conductive among clusters.

According to the present invention, a surface part of a single crystal semiconductor substrate is thinned and the single crystal semiconductor substrate is bonded to a supporting substrate, so that a photoelectric conversion device can be obtained in which conductive clusters are dispersed between a lower-layer unit cell including a single crystal semiconductor layer with a thickness of 10 μm or less as a photoelectric conversion layer and an upper-layer unit cell including a non-single-crystal semiconductor layer as a photoelectric conversion layer, which is stacked over the lower-layer unit cell. That is, the photoelectric conversion device in which the conductive clusters are dispersed between the lower-layer unit cell including the single crystal semiconductor layer as a photoelectric conversion layer and the upper-layer unit cell including the non-single-crystal semiconductor layer as a photoelectric conversion layer, which is stacked over the lower-layer unit cell can be manufactured over a large-sized glass substrate having an allowable temperature limit of 700° C. or lower.

The conductive clusters are located between the lower-layer unit cell and the upper-layer unit cell and forms an ohmic contact; thus, the conductive clusters have an effect of smoothly flowing current between the both unit cells. The conductive clusters are dispersed to be placed; thus, the conductive clusters have an effect of reducing loss of light entering the lower-layer unit cell from the upper-layer unit cell.

In the present invention, the single crystal semiconductor layer is obtained by separation of a surface layer of the single crystal semiconductor substrate. Since the single crystal semiconductor substrate can be reused, resources can be effectively used.

BRIEF DESCRIPTION OF THE DRAWINGS

In the accompanying drawings:

FIGS. 7A to 7D are cross-sectional views illustrating manufacturing steps of a stack photoelectric conversion device;

FIGS. 8A to 8C are cross-sectional views illustrating manufacturing steps of a stack photoelectric conversion device;

DETAILED DESCRIPTION OF THE INVENTION

Figure 1:
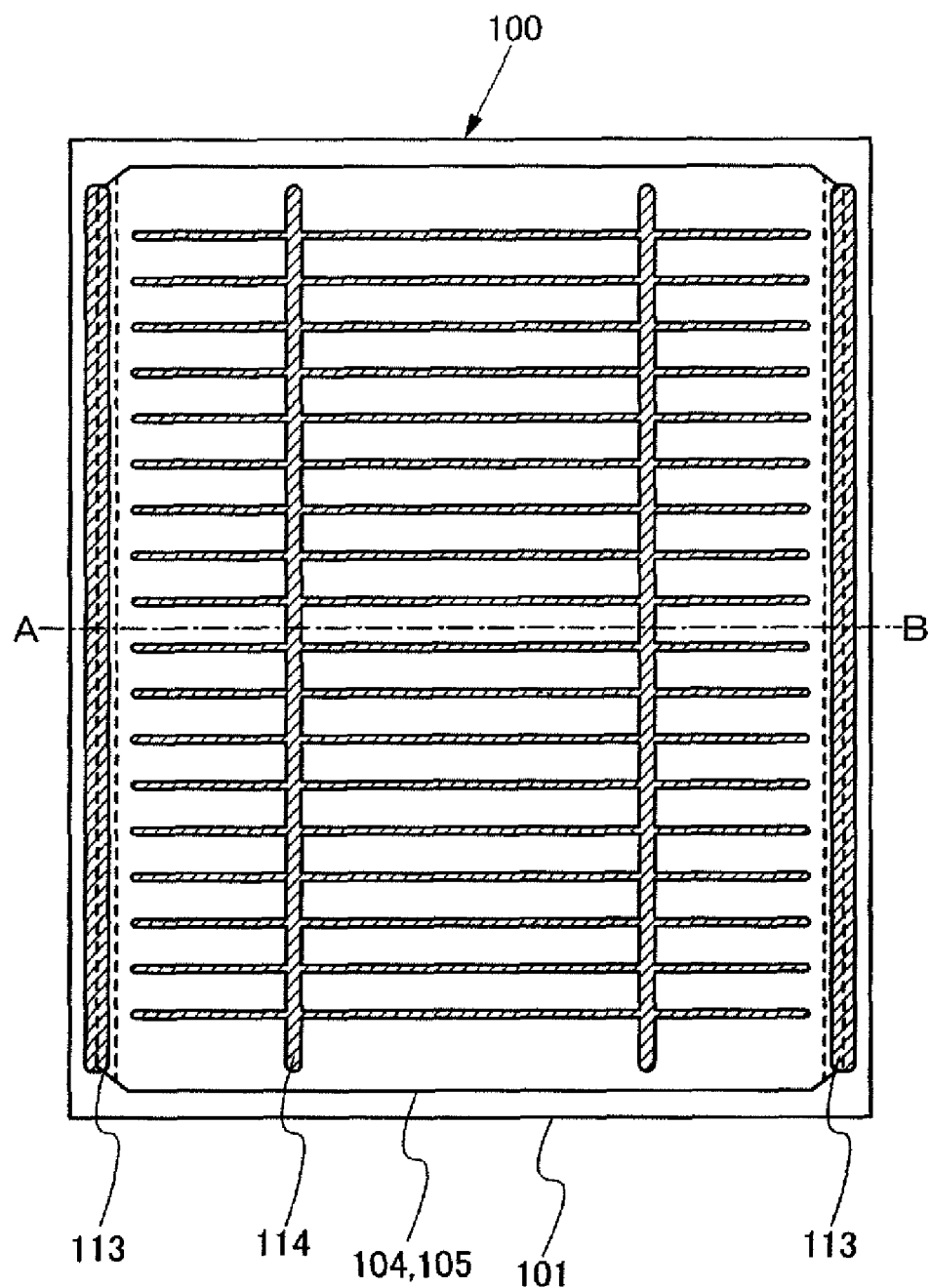
FIG. 1 is a plan view showing a structure of a tandem photoelectric conversion device.

Embodiment Modes of the present invention will be hereinafter described in detail with reference to the accompanying drawings. Note that the present invention is not limited to the description below and the modes and details of the present invention can be modified in various ways without departing from the purpose and scope of the present invention. Therefore, the present invention should not be interpreted as being limited to the description below of Embodiment Modes. In the structure of the present invention hereinafter described, reference numerals indicating the same portions are used in common in different drawings.

Embodiment Mode 1

FIG. 1 is a plan view of a photoelectric conversion device 100 of this embodiment mode. This photoelectric conversion device 100 is provided with a first unit cell 104 and a second unit cell 105 which are fixed onto a supporting substrate 101. The first unit cell 104 and the second unit cell 105 include a semiconductor junction, and accordingly photoelectric conversion is performed by the semiconductor junction. Note that conductive clusters are dispersed between the first unit cell 104 and the second unit cell 105.

A first electrode is provided on the supporting substrate 101 side of the first unit cell 104, and a second electrode is provided on a surface side of the second unit cell 105. The first electrode is connected to a first auxiliary electrode 113. A second auxiliary electrode 114 is provided over the second electrode. The photoelectric conversion device 100 of this embodiment mode has a structure in which the first unit cell 104 and the second unit cell 105 are stacked over the supporting substrate 101 having an insulating surface. Thus, a structure is employed in which a positive electrode and a negative electrode are exposed on the same surface side of the supporting substrate 101.

Figure 2:
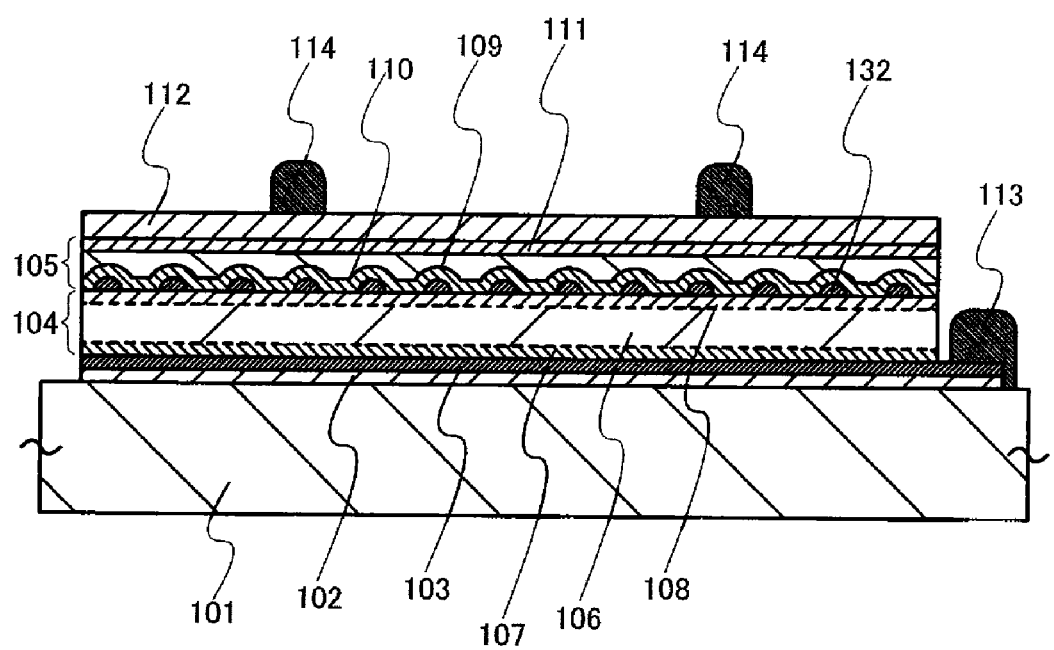
FIG. 2 is a cross-sectional view showing a structure of a tandem photoelectric conversion device.

FIG. 2 shows a cross-sectional structure of the photoelectric conversion device which is cut along a line A-B of FIG. 1. FIG. 2 shows the photoelectric conversion device in which the first unit cell 104 and the second unit cell 105 are stacked over the supporting substrate 101. The supporting substrate 101 is a substrate having an insulating surface or an insulating substrate. For example, a variety of glass substrates used in the electronics industry, such as an aluminosilicate glass substrate, an aluminoborosilicate glass substrate, and a barium borosilicate glass substrate, can be used.

An insulating layer 102 is provided between the supporting substrate 101 and the first unit cell 104. A first electrode 103 is provided between the first unit cell 104 and the insulating layer 102. A second electrode 112 is provided over the second unit cell 105. The insulating layer 102 is bonded to the supporting substrate 101, and furthermore, is firmly attached to the first electrode 103, so that the first unit cell 104 and the second unit cell 105 are fixed onto the supporting substrate 101. The insulating layer 102 is formed of an insulating film having a smooth and hydrophilic surface so as to be bonded to the supporting substrate 101.

Single crystal silicon is typically used for a single crystal semiconductor layer 106 of the first unit cell 104. Alternatively, a polycrystalline semiconductor (typically polycrystalline silicon) layer can be used instead of a single crystal semiconductor layer. Each of a first impurity semiconductor layer 107 having one conductivity type and a second impurity semiconductor layer 108 having an opposite conductive type to the conductivity type of the first impurity semiconductor layer 107 is formed by addition of a predetermined impurity to the single crystal semiconductor layer 106. In the case where the first impurity semiconductor layer 107 is a p-type semiconductor layer, the second impurity semiconductor layer 108 is an n-type semiconductor layer, and vice versa. An element belonging to Group 13 of the periodic table, such as boron is used as a p-type impurity, and an element belonging to Group 15 of the periodic table, such as phosphorus or arsenic is used as an n-type impurity. An impurity element can be added by ion implantation or ion doping. In this specification, "ion implantation" refers to a method in which an ionized gas is mass-separated and added into a semiconductor, and "ion doping" refers to a method in which a semiconductor is irradiated with an ionized gas without mass separation being performed.

The single crystal semiconductor layer 106 is formed in such a manner that a single crystal semiconductor substrate is thinned. For example, hydrogen ions are added into the single crystal semiconductor substrate at a predetermined depth to form a damaged layer whose crystalline structure is destroyed and in which hydrogen exist unevenly at a high concentration. After that, heat treatment is performed to cleave the single crystal semiconductor substrate at the damaged layer and a surface layer that is a single crystal semiconductor layer is separated. Alternatively, a method may be applied in which a single crystal semiconductor is epitaxially grown on porous silicon and the porous silicon layer is cleaved to be separated by water jetting. As the single crystal semiconductor substrate, a single crystal silicon wafer is typically used.

The thickness of the single crystal semiconductor layer 106 is greater than or equal to 1 μm and less than or equal to 10 μm, preferably greater than or equal to 1 μm and less than or equal to 5 μm. In the case where a single crystal silicon semiconductor is used as the single crystal semiconductor layer 106, since the single crystal silicon semiconductor has an energy gap of 1.12 eV and is an indirect bandgap semiconductor, the above-described thickness is suitable in order to absorb solar light.

Amorphous silicon is typically used for a non-single-crystal semiconductor layer 109 of the second unit cell 105. Alternatively, a microcrystalline semiconductor (typically microcrystalline silicon) layer can be used instead of a non-single-crystal semiconductor layer. A third impurity semiconductor layer 110 having one conductivity type and a fourth impurity semiconductor layer 111 having an opposite conductivity type to the one conductivity type are formed of an amorphous semiconductor layer or a microcrystalline semiconductor layer which contains a predetermined impurity. Typically, amorphous silicon or microcrystalline silicon is used, and amorphous silicon carbide is alternatively used. In the case where the third impurity semiconductor layer 110 is a p-type semiconductor layer, the fourth impurity semiconductor layer 111 is an n-type semiconductor layer, and vice versa.

The non-single-crystal semiconductor layer 109 is formed by decomposition of a reactive gas containing a semiconductor material gas by electromagnetic energy. As the semiconductor material gas, a gas containing hydride of silicon typified by silane or disilane is used, and a gas containing fluoride of silicon or chloride of silicon is used as well. Such a semiconductor material gas or a semiconductor material gas mixed with hydrogen or an inert gas is used as a reactive gas. The non-single-crystal semiconductor layer 109 is formed by a plasma CVD method in which a thin film is formed with use of the reactive gas by application of high-frequency electric power of 10 MHz to 200 MHz as electromagnetic energy. As electromagnetic energy, microwave electric power of 1 GHz to 5 GHz, typically 2.45 GHz, may be applied instead of the high-frequency electric power. The third impurity semiconductor layer 110 and the fourth impurity semiconductor layer 111 are formed by a plasma CVD method in a similar manner, and in the case where the third impurity semiconductor layer 110 or the fourth impurity semiconductor layer 111 is made to be p-type, diborane is added to the reactive gas as an impurity, and in the case where either of them is made to be p-type, phosphine is added to the reactive gas as an impurity. An amorphous silicon layer is typically used as the non-single-crystal semiconductor layer 109.

Note that a plasma CVD method is a kind of chemical vapor deposition method. A plasma CVD method is used, for formation of a film of semiconductor such as silicon or a film of insulator typified by silicon oxide or silicon nitride, as a technique for forming a thin film. In a plasma CVD method, a gas containing a raw material is added with electromagnetic energy to form plasma, so that the raw material is in a radical state and rich in reactivity; thus, a thin film is formed over a substrate by the reaction of radicals. A plasma CVD method is given in a typical method in this embodiment mode. However, similar radical reaction can be generated by application of photo energy or heat energy as another chemical vapor deposition method; thus, a photo CVD method or a thermal CVD method can be used alternatively.

The thickness of the non-single-crystal semiconductor layer 109 is greater than or equal to 50 nm and less than or equal to 300 nm, preferably greater than or equal to 100 nm and less than or equal to 200 nm. In the case where an amorphous silicon semiconductor is used for the non-single-crystal semiconductor layer 109, since the amorphous silicon semiconductor has an energy gap of 1.75 eV, the thickness is set in the above-described range, and accordingly light in a wavelength region shorter than 600 nm can be absorbed and photoelectric conversion can be performed.

As the non-single-crystal semiconductor layer 109, a microcrystalline semiconductor layer (typically a microcrystalline silicon layer) can be used. $SiH_4$ is a typical semiconductor material gas used for forming the microcrystalline semiconductor layer, and $Si_2H_6$ is alternatively used. Further alternatively, $SiH_2Cl_2$, $SiHCl_3$, $SiCl_4$, $SiF_4$, or the like may be mixed into $SiH_4$ as appropriate. With use of the semiconductor material gas diluted with hydrogen or fluorine, or a mixture of hydrogen or fluorine and one or a plurality of rare gas elements selected from helium, argon, krypton, and neon, the microcrystalline semiconductor layer is formed by a plasma CVD method. The semiconductor material gas is preferably diluted in a range of 10 to 3000 times as a dilution ratio. The microcrystalline semiconductor layer is formed by glow discharge plasma generated under reduced pressure of 0.1 Pa to 133 Pa. In order to generate plasma, high-frequency electric power of 10 MHz to 200 MHz or microwave electric power of 1 GHz to 5 GHz, typically 2.45 GHz, instead of high-frequency electric power, is applied.

The microcrystalline semiconductor layer has lattice distortion which changes the optical characteristics from the indirect transition type of single-crystal silicon into the direct transition type. The optical characteristics are changed into the direct transition type by lattice distortion of at least 10%. The microcrystalline semiconductor layer has an optical characteristic in which a direct bandgap semiconductor and an indirect bandgap semiconductor are mixed due to local distortion. The energy gap of the microcrystalline silicon layer is approximately 1.45 eV and is wider than that of single crystal silicon; thus, light of a wavelength region shorter than 600 nm can be absorbed to perform photoelectric conversion.

Conductive clusters 132 are dispersed between the first unit cell 104 and the second unit cell 105 located over the first unit cell 104. The conductive clusters 132 are actually dispersed over the second impurity semiconductor layer 108, and the surface parts of the conductive clusters 132 are covered with the third impurity semiconductor layer 110. Each of the conductive clusters 132 has a grain diameter of 100 nm or less, preferably greater than or equal to 5 nm and less than or equal to 50 nm. The conductive clusters 132 are formed of a metal compound or an alloy containing one or a plurality of elements selected from titanium, chromium, cobalt, nickel, and molybdenum, or nitride or oxide of the above-described metal.

The density of the conductive clusters 132 dispersed over the second impurity semiconductor layer 108 may be greater than or equal to $1/\mu m^2$ and less than $100/\mu m^2$. Even when a region in which opposite junction is formed by the second impurity semiconductor layer 108 having one conductivity type and the third impurity semiconductor layer 110 having an opposite conductivity type to the one conductivity type exists, an ohmic contact is formed by a portion including the conductive clusters 132 lying between the second impurity semiconductor layer 108 and the third impurity semiconductor layer 110; thus, current can be passed smoothly between the first unit cell 104 and the second unit cell 105.

The photoelectric conversion device of this embodiment mode has a structure in which light enters from the second electrode 112 side. The second electrode 112 is formed using a transparent conductive film material such as indium tin oxide, tin oxide, or zinc oxide. The first electrode 103 is formed using a metal material selected from titanium, molybdenum, tungsten, tantalum, chromium, and nickel. The first electrode 103 has a structure in which a nitride layer of titanium, molybdenum, tungsten, or tantalum is included and the nitride layer is in contact with the first impurity semiconductor layer 107. Nitride metal lies between a semiconductor layer and a metal layer, whereby the adhesion can be increased.

Figure 3:
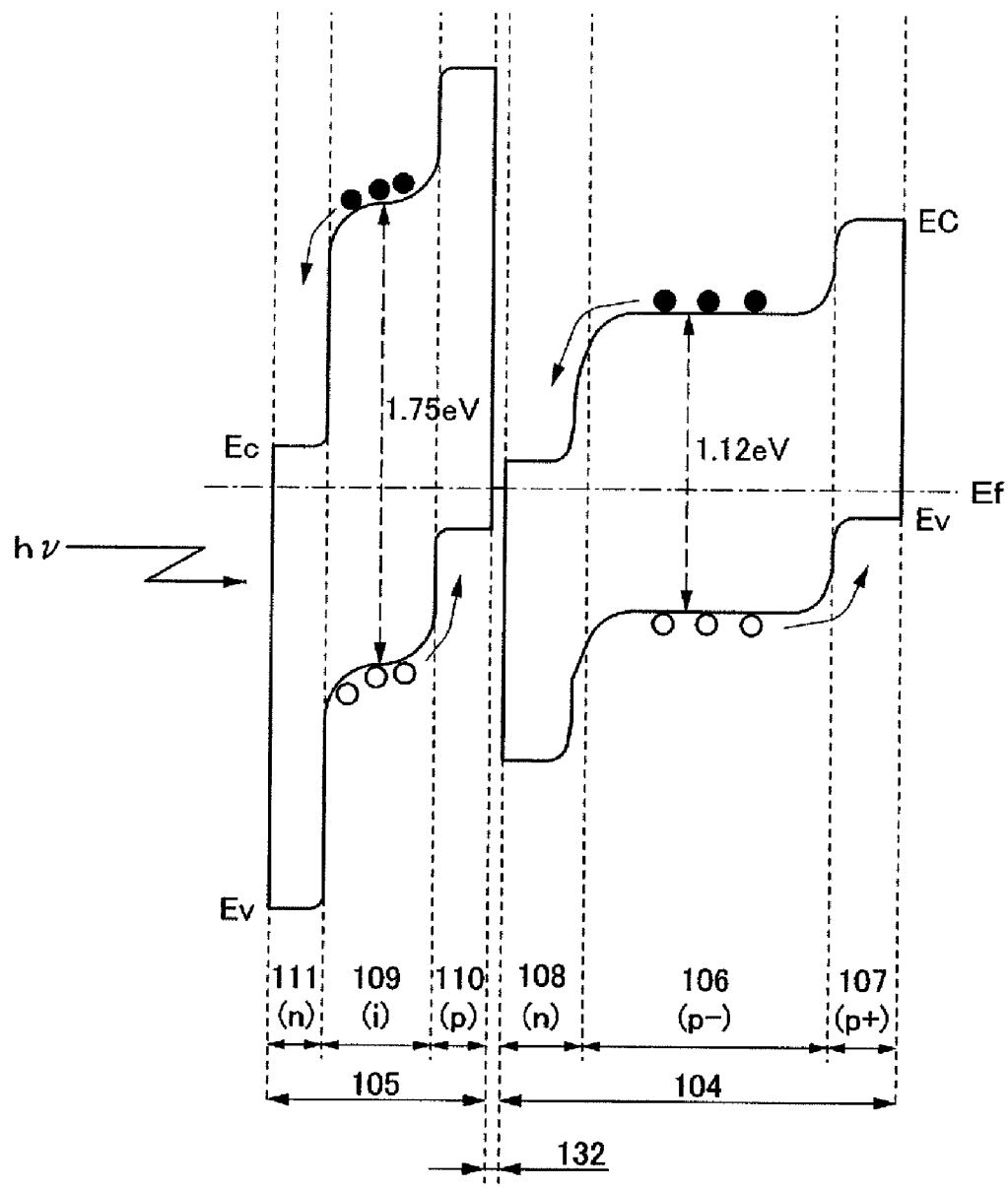
FIG. 3 shows an example of an energy band diagram of a tandem photoelectric conversion device.

FIG. 3 is an energy band diagram in the case of using the first unit cell 104 including the single crystal semiconductor layer 106 having an energy gap of 1.12 eV and the second unit cell 105 including the non-single-crystal semiconductor layer 109 having an energy gap of 1.75 eV. The second unit cell 105 including the non-single-crystal semiconductor layer 109 which has a wide energy gap is located on the side where light enters, and the first unit cell 104 including the single crystal semiconductor layer 106 which has a narrow energy gap is located behind the second unit cell 105. Note that the case is shown where the first impurity semiconductor layer 107 and the third impurity semiconductor layer 110 have a p-type semiconductor and the second impurity semiconductor layer 108 and the fourth impurity semiconductor layer 111 have an n-type semiconductor.

As shown in the band model diagram of FIG. 3, electrons excited by absorption of light flow to the n-type semiconductor side, and holes flow to the p-type semiconductor side. A p-n junction is formed at a connection portion of the first unit cell 104 and the second unit cell 105, and a diode is inserted in a direction opposite to a direction of current flow in view of an equivalent circuit. However, the conductive clusters 132 lie between the n-type second impurity semiconductor layer 108 and the p-type third impurity semiconductor layer 110 and recombination current actually flows through the conductive clusters 132; accordingly, an ohmic current can be passed.

In the tandem photoelectric conversion device of FIG. 2, with use of the first unit cell 104 formed of the single crystal semiconductor layer 106 as a bottom cell, light having a long wavelength of 800 nm or more can be absorbed and photoelectric conversion can be performed, which contributes to increase in photoelectric conversion efficiency. In this case, since the single crystal semiconductor layer 106 is thinned to less than or equal to 10 μm, loss of photogenerated carriers due to recombination can be reduced. The conductive clusters 132 exits between the first unit cell 104 and the second unit cell 105 and forms an ohmic contact; thus, current can be passed smoothly between the both unit cells. When the conductive clusters 132 are dispersed to be placed, loss of light entering the second unit cell 105 from the first unit cell 104 can be reduced.

Figure 4:
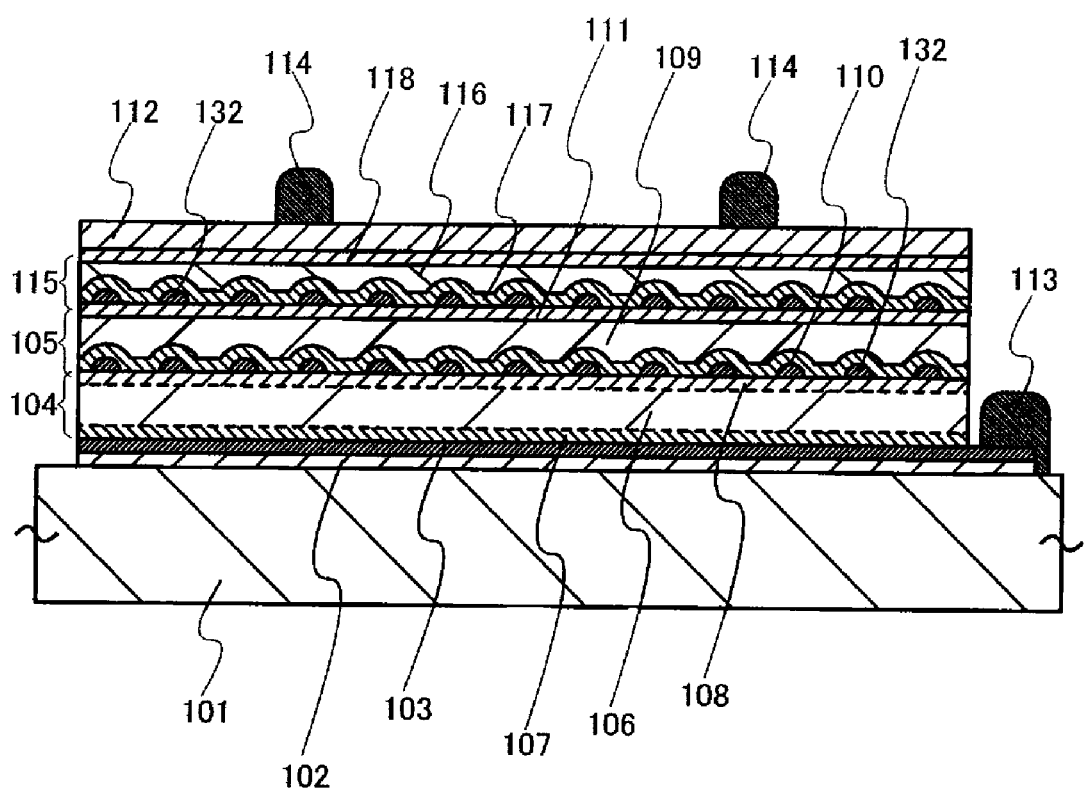
FIG. 4 is a cross-sectional view showing a structure of a stack photoelectric conversion device.

FIG. 4 shows an example of a stacked-layer photoelectric conversion device (a stack photoelectric conversion device) in which three unit cells are stacked. The first unit cell 104 provided over the supporting substrate 101 includes the single crystal semiconductor layer 106 as a photoelectric conversion layer, the second unit cell 105 over the first unit cell 104 includes the non-single-crystal semiconductor layer 109 as a photoelectric conversion layer, and a third unit cell 115 over the second unit cell 105 includes a non-single-crystal semiconductor layer 116 as a photoelectric conversion layer. The conductive clusters 132 are dispersed between the first unit cell 104 and the second unit cell 105 thereover. In addition, the conductive clusters 132 are also dispersed between the second unit cell 105 and the third unit cell 115.

In this case, since the energy gap of the single crystal semiconductor layer 106 is 1.12 eV, the energy gap of the non-single-crystal semiconductor layer 109 of the second unit cell 105 which is located on the side where light enters more than the first unit cell 104 is preferably 1.45 eV to 1.65 eV, and the energy gap of the non-crystal semiconductor layer 116 of the third unit cell 115 is preferably 1.7 eV to 2.0 eV. This is because when ranges of wavelengths of light absorbed by the unit cells are made different, solar light can be absorbed efficiently.

Amorphous silicon germanium or amorphous silicon is used in order to make the non-single-crystal semiconductor layer 109 of the second unit cell 105 have an energy gap of 1.45 eV to 1.65 eV. Amorphous silicon (1.75 eV) or amorphous silicon carbide (1.8 eV to 2.0 eV) is used in order to make the non-single-crystal semiconductor layer 116 of the third unit cell 115 have an energy gap of 1.7 eV to 2.0 eV.

The conductive clusters 132 are dispersed between the unit cells; thus, current can be passed smoothly between the unit cells. Note that in FIG. 4, a fifth impurity semiconductor layer 117 has a similar conductivity type to the third impurity semiconductor layer 110, and a sixth impurity semiconductor layer 118 has a similar conductivity type to the fourth impurity semiconductor layer 111, and detailed descriptions thereof are omitted.

Embodiment Mode 2

Next, a manufacturing method of the photoelectric conversion device 100 will be described on the premise of the case of FIG. 2 as a cross-sectional structure taken along the line A-B of FIG. 1.

Figure 5A:
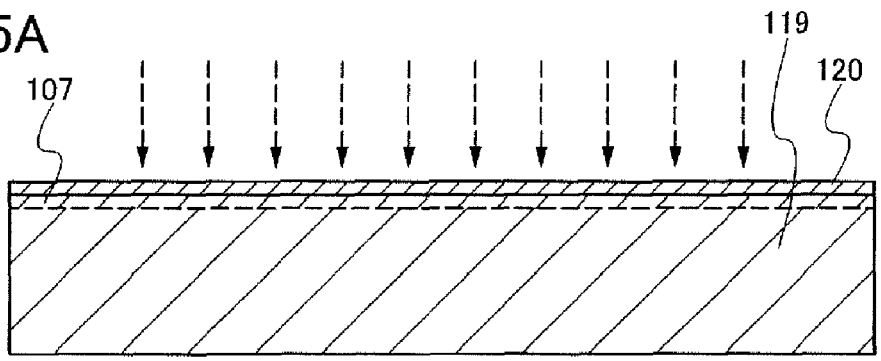
FIGS. 5A to 5D are cross-sectional views illustrating manufacturing steps of a stack photoelectric conversion device.

A semiconductor substrate 119 shown in FIG. 5A is cut off from a circular single crystal semiconductor substrate to have a substantially quadrangular shape. Needless to say, the plane shape of the semiconductor substrate 119 is not particularly limited. However, in the case where a supporting substrate which forms a single crystal semiconductor layer is rectangular, the semiconductor substrate 119 is preferably substantially quadrangular. Single crystal silicon whose surface is mirror-polished is typically preferable for the semiconductor substrate 119. This is because the semiconductor substrate 119 is firmly attached to the supporting substrate with an insulating layer for bonding interposed therebetween. For example, a p-type single crystal silicon wafer with a resistance of approximately 1 Ωcm to 10 Ωcm is used for the semiconductor substrate 119. The size of the single crystal silicon wafer is preferably greater than or equal to 300 mm in a diameter (a 12-inch silicon wafer). For example, a silicon wafer with 400 mm or 450 mm in a diameter (an 18-inch silicon wafer) is preferably used. This is because increase in the size of the single crystal silicon wafer makes it possible to reduce the area of a gap (a non-power generation region) generated when arranging a plurality of unit cells. Note that the plane shape of the semiconductor substrate 119 is preferably substantially quadrangular as described above.

A protective film 120 is preferably formed of a silicon oxide film, a silicon nitride film, or the like as an insulating film by a chemical vapor deposition method typified by a plasma CVD method. When a damaged layer is formed in the semiconductor substrate 119, the surface of the semiconductor substrate 119 is irradiated with ions and the planarity is damaged; thus, it is preferable to provide the protective film 120. The protective film 120 is preferably provided to a thickness of 10 nm to 200 nm.

Then, the first impurity semiconductor layer 107 having one conductivity type is formed in the semiconductor substrate 119. For example, boron is added as an impurity imparting one conductivity type to form the first impurity semiconductor layer 107 having p-type conductivity. In the photoelectric conversion device of this embodiment mode, the first impurity semiconductor layer 107 is placed at a surface opposite to the side where light enters to form a back surface field (BSF). It is preferable that boron be added with use of an ion doping apparatus in which $B_2H_6$ or $BF_3$ is used as a source gas, generated ions are accelerated by an electric field without mass separation being performed, and the substrate is irradiated with the generated ions. This is because the area to be irradiated with an ion beam can be increased and efficient treatment is possible even when the semiconductor substrate 119 has a size of more than 300 mm in diagonal. For example, a linear ion beam whose length of the long side is more than 300 mm is formed, and the semiconductor substrate 119 is processed so that one end to the other end thereof is irradiated with the linear ion beam; accordingly, the first impurity semiconductor layer 107 can be formed uniformly over an entire surface of the semiconductor substrate 119.

Figure 5B:
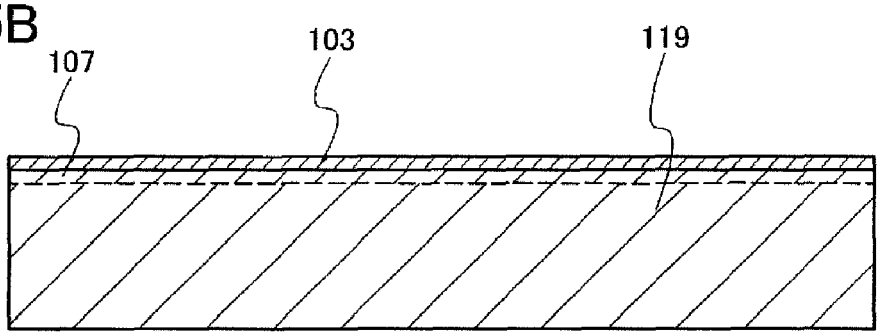

In FIG. 5B, the protective film 120 is removed, and the first electrode 103 is formed over the first impurity semiconductor layer 107. The first electrode 103 is preferably formed using heat resistant metal. As the heat resistant metal, a metal material such as titanium, molybdenum, tungsten, tantalum, chromium, or nickel is used. Alternatively, a two-layer structure of a nitride layer or an oxide layer formed of the above-described metal material and a layer formed of the above-described metal material may be employed. In this case, the nitride layer or the oxide layer and the first impurity semiconductor layer 107 are placed so as to be in contact with each other, whereby the adhesion between the first electrode 103 and the first impurity semiconductor layer 107 can be increased. The first electrode 103 is formed by a vacuum evaporation method or a sputtering method.

Figure 5C:
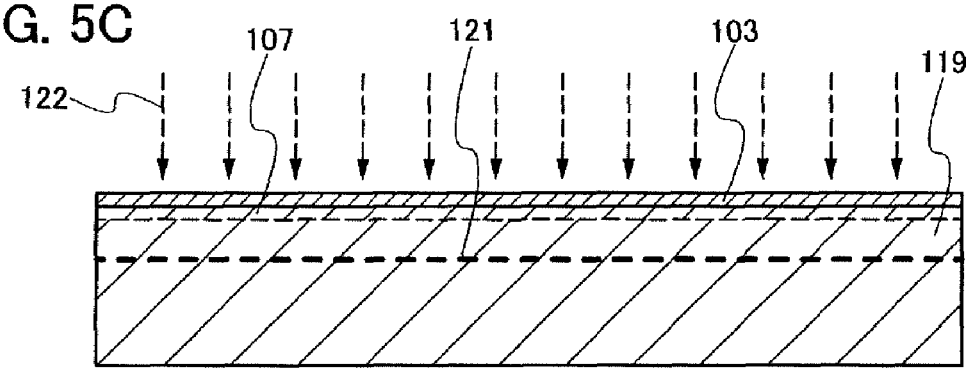

FIG. 5C shows a step in which the semiconductor substrate 119 is irradiated with an ion beam 122 containing hydrogen ions from the surface over which the first electrode 103 is formed to form a damaged layer 121. The hydrogen ions, preferably cluster ions typified by $H_3^+$, are added into the semiconductor substrate 119 to form the damaged layer 121 at a predetermined depth from the surface. The depth at which the damaged layer 121 is formed is controlled by the acceleration energy of the ions. Since the thickness of a single crystal semiconductor layer separated from the semiconductor substrate 119 depends on the depth at which the damaged layer 121 is formed, the electric field intensity which accelerates the cluster ions is determined in consideration of that. The damaged layer 121 is formed at a depth of less than 10 μm from the surface of the semiconductor substrate 119, that is, at a depth of greater than or equal to 0.1 μm and less than 10 μm, preferably greater than or equal to 1 μm and less than or equal to 5 μm. Addition of the cluster ions into the semiconductor substrate 119 through the first electrode 103 can prevent the surface of the semiconductor substrate 119 from being damaged due to the ion irradiation.

The cluster ions which are hydrogen ions and typified by $H_3^+$ are added with use of an ion doping apparatus in such a manner that hydrogen plasma is generated, and ions generated in the plasma are accelerated by an electric field without mass separation being performed. With use of the ion doping apparatus, the semiconductor substrate 119 having a large area can be easily irradiated with the cluster ions.

Figure 10:
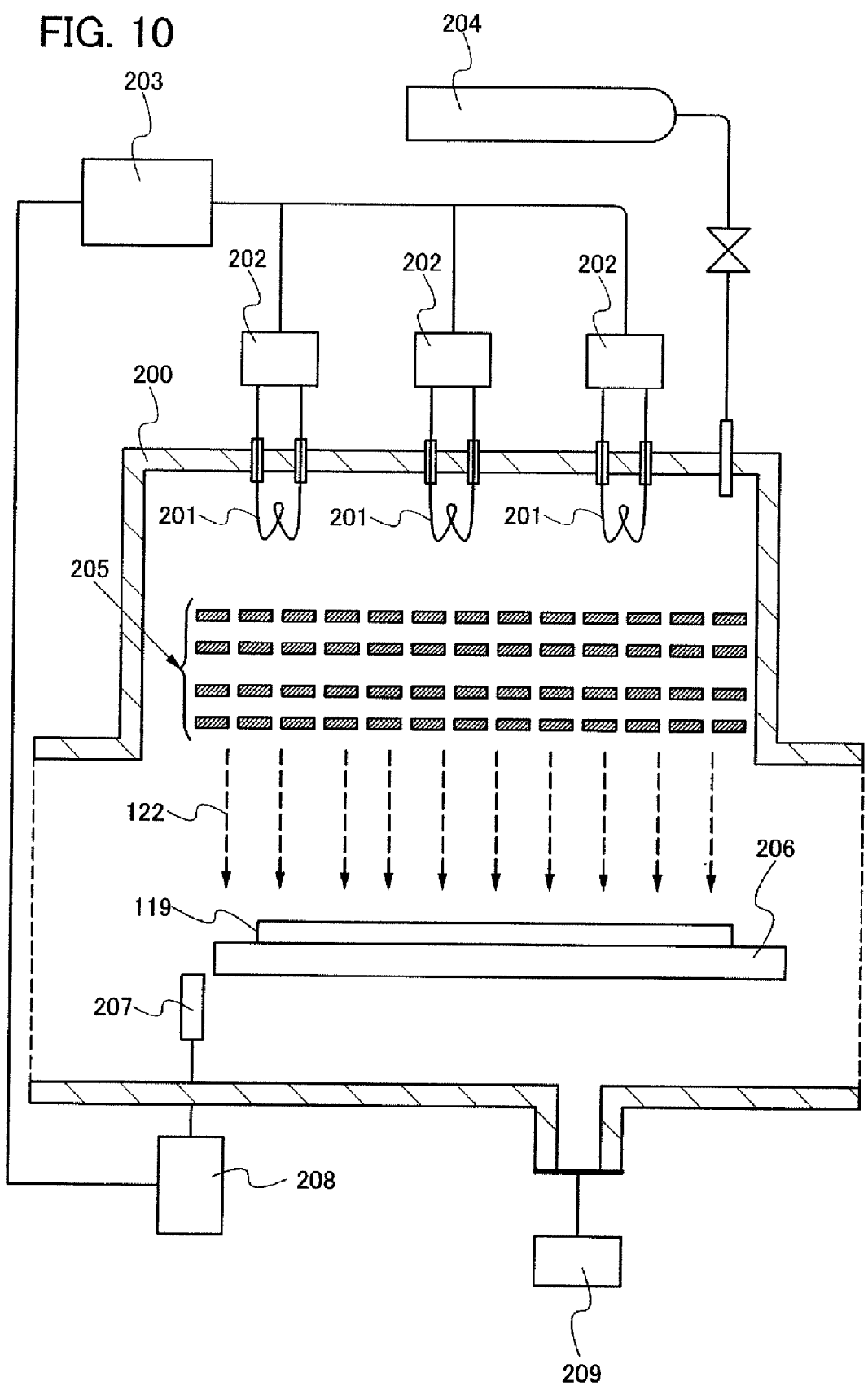
FIG. 10 is a diagram illustrating a structure of an ion doping apparatus.

FIG. 10 is a diagram which describes a structure of an ion doping apparatus in which the semiconductor substrate 119 is irradiated with plural kinds of ions generated in an ion source 200 without mass separation being performed. A predetermined gas such as hydrogen is supplied to the ion source 200 from a gas supply portion 204. The ion source 200 is provided with filaments 201. Each of filament power sources 202 applies arch discharge voltage to the filament 201 and adjusts current flowing into the filament 201. The gas supplied from the gas supply portion 204 is exhausted through an exhaust system 209.

Ions generated in the ion source 200 are extracted by an extraction electrode system 205, so that an ion beam 122 is formed. The semiconductor substrate 119 placed on a transposition board 206 is irradiated with the ion beam 122. The proportion of ion species contained in the ion beam 122 is calculated with a mass analysis tube 207 which is provided near the transposition board 206. The ion density calculated with the mass analysis tube 207 may be converted into a signal by a mass spectrometer 208 and the result may be fed back to a power source control portion 203. The power source control portion 203 can control the filament power sources 202 in accordance with the calculation result of the ion density.

A gas such as hydrogen supplied from the gas supply portion 204 flows through a chamber of the ion doping apparatus and is exhausted through the exhaust system 209. Hydrogen supplied to the ion source 200 is ionized in accordance with the reaction represented by Formula (1).

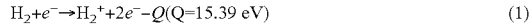

$$H_2 + e^- \rightarrow H_2^+ + 2e^- - Q(Q=15.39 \text{ eV}) \tag{1}$$

The pressure inside the chamber of the ion doping apparatus is $1 \times 10^{-2}$ Pa to $1 \times 10^{-1}$ Pa, and the degree of ionization is not so high; accordingly, the amount of $H_2$ which is a material gas is larger than that of $H_2^+$ ions. Thus, $H_2^+$ ions generated in the ion source are reacted with $H_2$ before being extracted by the extraction electrode system 205, and the reaction represented by Formula (2) occurs.

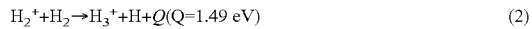

$$H_2^+ + H_2 \rightarrow H_3^+ + H + Q(Q=1.49 \text{ eV}) \tag{2}$$

Since $H_3^+$ exists as a molecule which is more stable than $H^+$ and $H_2^+$, the higher the percentage of colliding with $H_2$ is, the more $H_3^+$ is generated.

This is obvious from the mass analysis results of the ion beam 122 which flows into the transposition board 206, using the mass analysis tube 207, and the proportion of $H_3^+$ ions is greater than or equal to 70% with respect to the total amount of ion species $H^+$, $H_2^+$, and $H_3^+$. Thus, the substrate is irradiated with the ion beam containing a great amount of generated $H_3^+$, which are cluster ions, whereby significant effects can be obtained that irradiation efficiency of hydrogen atoms is increased more than the case of irradiation with $H^+$ and $H_2^+$ and the semiconductor substrate 119 can contain hydrogen at a high concentration even if the dose is small.

The proportion of $H_3^+$ is high as described above, so that the damaged layer 121 can contain hydrogen of greater than or equal to $1 \times 10^{20}$ atoms/cm$^3$. The crystal structure of the damaged layer 121 formed in the semiconductor substrate 119 is damaged and microvoids are formed therein, so that the damaged layer 121 has a porous structure. Therefore, the volume of microvoids formed in the damaged layer 121 is changed by thermal treatment at a relatively low temperature (less than or equal to 600° C.), and the single crystal semiconductor layer can be cleaved along the damaged layer 121.

When the surface of the semiconductor substrate 119 is scanned with a linear ion beam whose length is longer than the length of one side of the semiconductor substrate 119 which is substantially quadrangular for addition of cluster ions, the depth at which the damaged layer 121 is formed can be even.

Figure 5D:
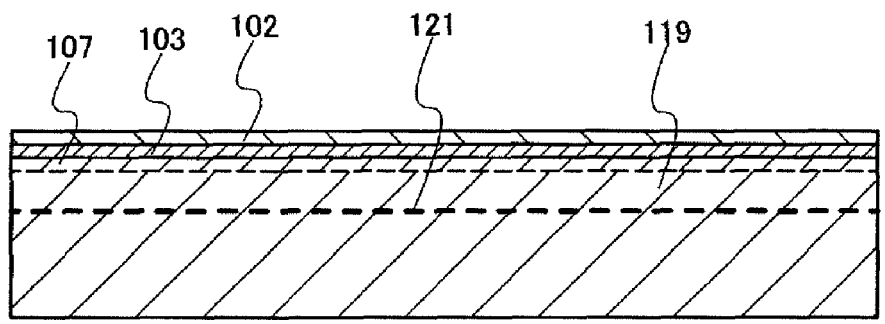

FIG. 5D shows a step in which an insulating layer 102 is formed over the first electrode 103. The insulating layer 102 is formed of an insulating film such as a silicon oxide film, a silicon oxynitride film, a silicon nitride oxide film, or a silicon nitride film. There is no limitation on the material to form the insulating layer 102 as long as an insulating film can be formed, and a film whose surface is smooth and hydrophilic may be used. As for the smoothness of the insulating layer 102, the mean surface roughness (Ra) is preferably less than or equal to 1 nm, more preferably less than or equal to 0.5 nm. Note that the "mean surface roughness" in this specification refers to a mean surface roughness obtained by three-dimensional expansion of centerline mean roughness which is defined by JIS B0601 so as to be able to be applied to a measurement surface.

Note that a silicon oxynitride film means a film which contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film which includes more nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above if the total number of atoms contained in the silicon oxynitride film or the silicon nitride oxide film is defined as 100 at. %.

As silicon oxide containing hydrogen, for example, silicon oxide formed by a chemical vapor deposition method using organosilane is preferable. For example, with use of a silicon oxide film as the insulating layer 102 which is formed using organosilane, a bond between the supporting substrate and a semiconductor layer to be transferred can be made strong. For the organosilane, an organic compound which contains silicon, such as tetraethoxysilane (TEOS) ($Si(OC_2H_5)_4$), tetramethylsilane (TMS) ($Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and tris(dimethylamino)silane ($SiH(N(CH_3)_2)_3$) or the like can be used.

Silicon nitride containing hydrogen can be formed by a plasma CVD method using a silane gas and an ammonia gas. Hydrogen may be added to the gases. Silicon nitride containing oxygen and hydrogen can be formed by a plasma CVD method using a silane gas, an ammonia gas, and a nitrous oxide gas. In any case, any of silicon oxide, silicon oxynitride, or silicon nitride oxide, which contains hydrogen and is formed by a chemical vapor deposition method such as a plasma CVD method, a low-pressure CVD method or a normal-pressure CVD method using a silane gas, or the like as a source gas can be used. The recommended deposition temperature of the insulating layer 102 is 350° C. or lower, which is the temperature at which dehydrogenation from the damaged layer 121 formed in the single crystal semiconductor substrate does not occur.

Figure 6A:
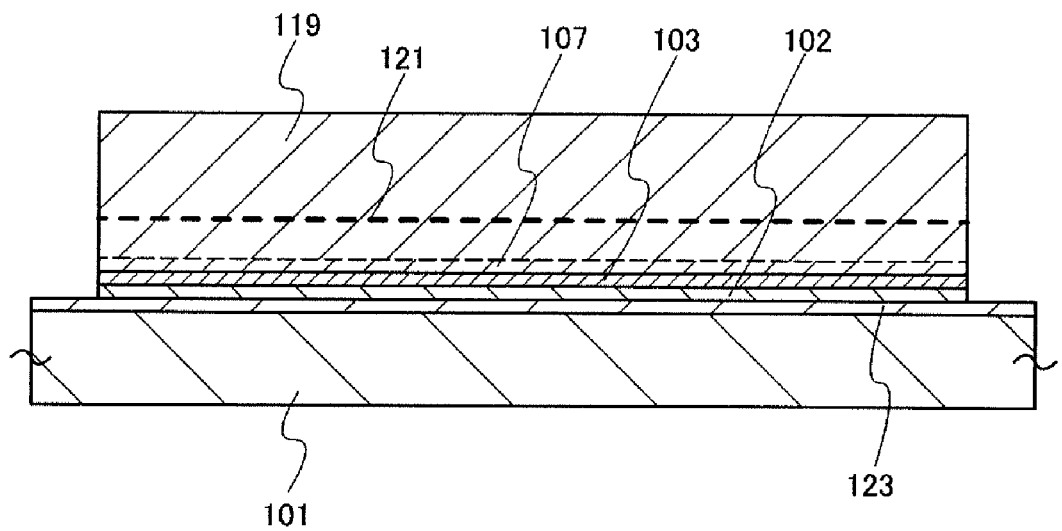
FIGS. 6A and 6B are cross-sectional views illustrating manufacturing steps of a stack photoelectric conversion device.

FIG. 6A shows a step in which the supporting substrate 101 and the semiconductor substrate 119 are bonded to each other. This bond is formed in such a manner that the insulating layer 102 whose surface is smooth and hydrophilic is firmly attached to the supporting substrate 101. This bond is formed by a hydrogen bond or Van der Waals forces. Hydroxyl groups or water molecules on surfaces of the semiconductor substrate 119 and the supporting substrate 101 which have become hydropholic serve as an adhesive, whereby the bond is formed. The water molecules are diffused by heat treatment, and silanol groups (Si—OH) of remaining components are bonded to each other by a hydrogen bond. Further, in this bonding portion, by hydrogen being released, a siloxane bond (a Si—O—Si bond) is formed to generate a covalent bond, so that the semiconductor substrate 119 and the supporting substrate 101 can be bonded to each other strongly. Note that a silicon nitride film, a silicon nitride oxide film, or the like may be formed as a barrier layer 123 over a bonding surface of the supporting substrate 101. The barrier layer 123 is formed, so that contamination due to impurities from the supporting substrate 101 can be prevented.

Further, in order to favorably perform bonding between the supporting substrate 101 and the insulating layer 102, the bonding surface is preferably activated. For example, one or both of the surfaces which are to form a bond is/are irradiated with an atomic beam or an ion beam. In the case of using an atomic beam or an ion beam, an inert gas neutral atomic beam or inert gas ion beam of argon or the like can be used. It is also possible to activate the bonding surface by plasma irradiation or radical treatment. Such surface treatment facilitates formation of a bond between different materials even at a temperature of 400° C. or lower.

Figure 6B:
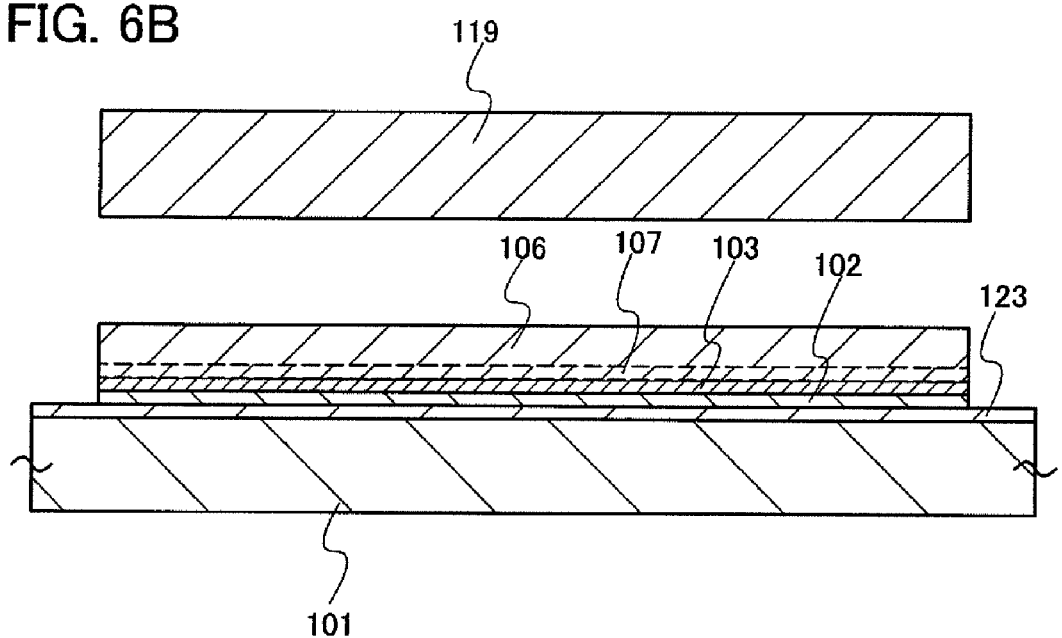

FIG. 6B shows a step in which the semiconductor substrate 119 is separated from the supporting substrate 101 by heat treatment, using the damaged layer 121 as a cleavage plane. The heat treatment is preferably performed at a temperature which is higher than or equal to the deposition temperature of the insulating layer 102 and lower than or equal to the allowable temperature limit of the supporting substrate 101. For example, by heat treatment performed at 400° C. to 600° C., the volume of microvoids formed in the damaged layer 121 is changed, and cleavage occurs along the region. Since the insulating layer 102 is bonded to the supporting substrate 101, the single crystal semiconductor layer 106 and the first electrode 103 remain over the supporting substrate 101. At this time, the thickness of the single crystal semiconductor layer 106 approximately corresponds to the depth at which the damaged layer 121 is formed, and the single crystal semiconductor layer 106 is formed to a thickness of greater than or equal to 0.1 μm and less than 10 μm, preferably greater than or equal to 1 μm and less than or equal to 5 μm.

Through the above-described steps, the single crystal semiconductor layer 106 which is fixed by the insulating layer 102 can be provided over the supporting substrate 101.

FIG. 7A shows a step in which an impurity having an opposite conductivity type to the conductivity type of the impurity added to the first impurity semiconductor layer 107 is added to the single crystal semiconductor layer 106 to form the second impurity semiconductor layer 108. For example, phosphorus or arsenic is added to form the second impurity semiconductor layer 108 having n-type conductivity. Note that since the surface of the single crystal semiconductor layer 106 is closest to the damaged layer 121 or contains part of the damaged layer 121, the surface of the single crystal semiconductor layer 106 is preferably removed by etching. Either dry etching or wet etching is performed for the etching.

The conductive clusters 132 are formed over the second impurity semiconductor layer 108. FIG. 7B shows how the surface of the second impurity semiconductor layer 108 is irradiated with an ion beam 133 which is conductive ions, for example, metal clusters. The conductive clusters 132 are formed of a metal compound or an alloy containing one or a plurality of elements selected from titanium, chromium, cobalt, nickel, and molybdenum, or nitride or oxide of the metal. In this case, the size of the conductive clusters 132 is less than or equal to 100 nm, preferably greater than or equal to 5 nm and less then or equal to 50 nm. The density of the conductive clusters 132 dispersed over the second impurity semiconductor layer 108 is greater than or equal to $1/\mu m^2$ and less than $100/\mu m^2$.

Figure 19:
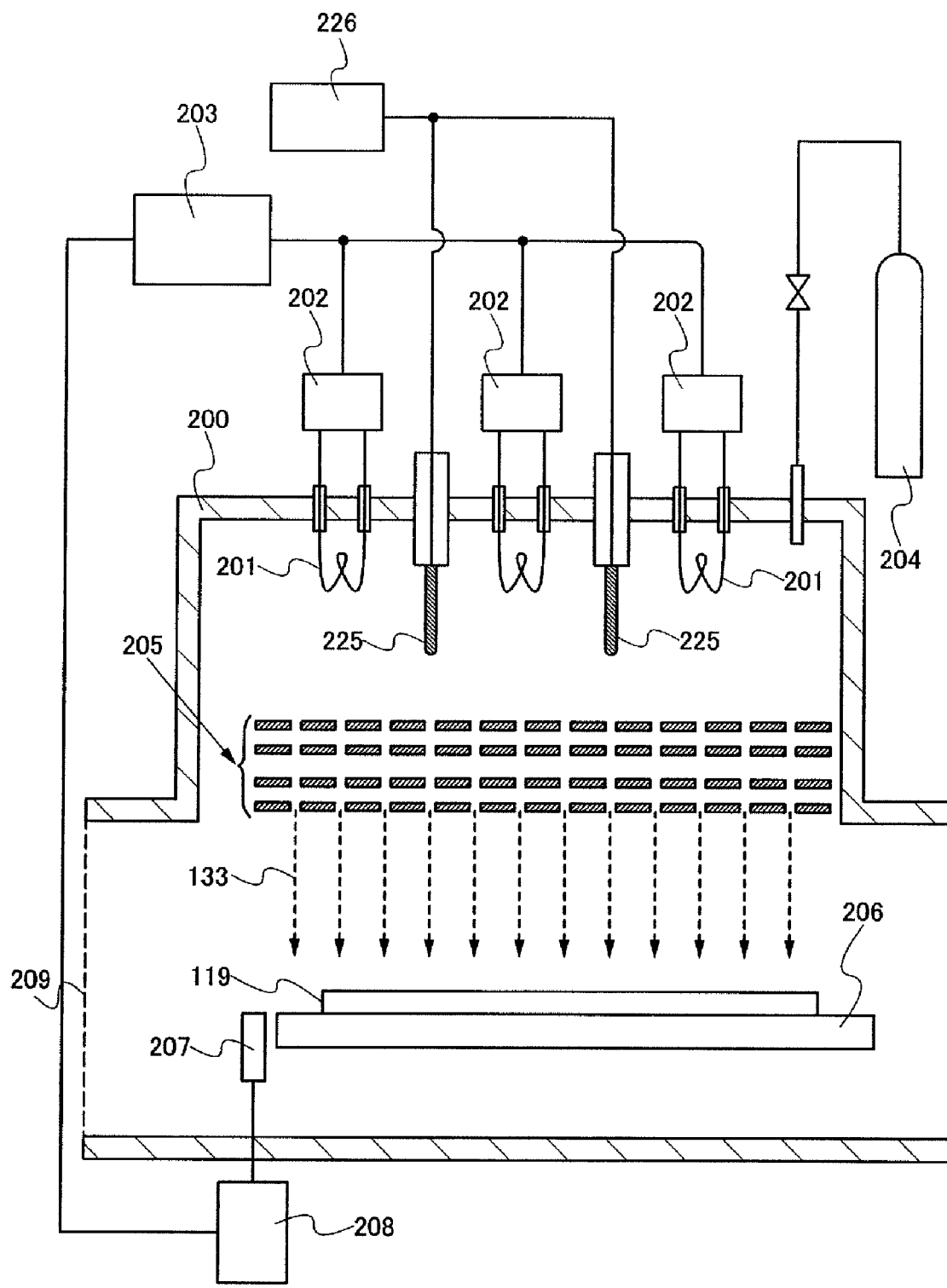
FIG. 19 is a diagram illustrating a structure of an ion doping apparatus which produces metal clusters.

FIG. 19 shows an example of a manufacturing apparatus which disperses the conductive clusters 132 to a surface part of the second impurity semiconductor layer 108. The main structure of this apparatus is the same as that shown in FIG. 10; therefore, detailed description is omitted and difference is described. The ion source 200 is provided with targets 225. The targets 225 preferably have a stick-like shape or a plate-like shape. The targets 225 are formed using a metal compound or an alloy containing one or a plurality of elements selected from titanium, chromium, cobalt, nickel, and molybdenum as a material. The targets 225 are connected to a bias power source 226, and ions enter when plasma is generated in the ion source 200. For example, hydrogen ions are generated in the ion source 200, and the hydrogen ions are made to collide with the targets 225 which are negatively biased. Metal ions in a cluster state or neutral metal clusters which are generated by a sputtering effect of hydrogen ions are ionized in plasma. The ionized metal clusters are extracted to the supporting substrate 101 side by the extraction electrode system 205. The supporting substrate 101 is irradiated with the metal cluster ion beam 133 at a relatively low acceleration voltage, which is 20 kV to 50 kV. In this case, by addition of nitrogen or oxygen to a gas which generates plasma in the ion source 200, nitride or oxide of the metal cluster can be formed. This treatment makes it possible to disperse the conductive clusters 132 which are the metal clusters or nitride or oxide of the metal clusters to the surface of the second impurity semiconductor layer 108.

As described above, the treatment for providing the conductive clusters over the second impurity semiconductor layer 108 can be performed successively with the formation step of the second impurity semiconductor layer 108; thus, continuity of the steps can be maintained. That is, when the conductive clusters are generated in a gas phase by ion doping with use of plasma reaction, productivity can be increased.

Next, as shown in FIG. 7C, the third impurity semiconductor layer 110, the non-single-crystal semiconductor layer 109, and the fourth impurity semiconductor layer 111 are sequentially formed over the second impurity semiconductor layer 108 and the conductive clusters 132. The third impurity semiconductor layer 110 is formed of a p-type amorphous semiconductor layer (e.g., a p-type amorphous silicon layer) or a p-type microcrystalline semiconductor layer (e.g., a p-type microcrystalline silicon layer) to a thickness of 10 nm to 20 nm. The non-single-crystal semiconductor layer 109 is formed of an amorphous silicon layer to a thickness of 50 nm to 300 nm (preferably greater than or equal to 100 nm and less than or equal to 200 nm). The fourth impurity semiconductor layer 111 is formed of an n-type amorphous semiconductor layer (e.g., an n-type amorphous silicon layer) or an n-type microcrystalline semiconductor layer (e.g., an n-type microcrystalline silicon layer) to a thickness of 20 nm to 60 nm.

The third impurity semiconductor layer 110, the non-single-crystal semiconductor layer 109, and the fourth impurity semiconductor layer 111 are formed by a plasma CVD method. As an electric power frequency for exciting plasma, high-frequency electric power in the HF band or the VHF band of 10 MHz to 200 MHz, or a microwave electric power of 1 GHz to 5 GHz, typically 2.45 GHz, is applied. As a reactive gas containing a semiconductor material gas, a gas containing hydride of silicon typified by silane or disilane, a gas containing fluoride of silicon or chloride of silicon is used, and hydrogen or an inert gas is mixed into the gas as appropriate. Diborane ($B_2H_6$) is added for controlling valence electron of the p-type semiconductor layer, and phosphine ($PH_3$) is used for controlling valence electron of the n-type semiconductor layer. Note that the impurity in the non-single-crystal semiconductor layer 109 is preferably reduced, and oxygen and nitrogen are each contained at less than or equal to $1\times10^{19}/cm^3$, preferably less than or equal to $5\times10^{18}/cm^3$.

As shown in FIG. 7D, the second electrode 112 is formed over the fourth impurity semiconductor layer 111. The second electrode 112 is formed using a transparent conductive material. For the transparent conductive material, metal oxide such as an indium tin oxide alloy (ITO), zinc oxide (ZnO), tin oxide ($SnO_2$), an ITO-ZnO alloy, or the like is used. The thickness of the second electrode 112 is 40 to 200 nm (preferably 50 to 100 nm). The sheet resistance of the second electrode 112 may be 20Ω/□ to 200Ω/□ (ohm/square).

The second electrode 112 is formed by a sputtering method or a vacuum evaporation method. In this case, the second electrode 112 is formed using a shadow mask so that the second electrode 112 is selectively formed in a region where the first unit cell 104 and the second unit cell 105 overlap with each other. Since the third impurity semiconductor layer 110, the non-single-crystal semiconductor layer 109, and the fourth impurity semiconductor layer 111 which are formed by a plasma CVD method are formed over an entire surface of the supporting substrate 101, in the case of removing an unnecessary region, the second electrode 112 can be used as a mask for etching.

Note that a conductive high molecular material (also referred to as a "conductive polymer") can be used instead of the above-described metal oxide in order to form the second electrode 112. As the conductive high molecular material, a π electron conjugated conductive high molecule can be used. For example, polyaniline or a derivative thereof, polypyrrole or a derivative thereof, polythiophene or a derivative thereof, and a copolymer of two or more kinds of those materials can be given.

FIG. 8A shows a step in which the fourth impurity semiconductor layer 111, the non-single-crystal semiconductor layer 109, the third impurity semiconductor layer 110, the second impurity semiconductor layer 108, the single crystal semiconductor layer 106, and the first impurity semiconductor layer 107 are etched using the second electrode 112 as a mask to expose edge portions of the first electrode 103. For the etching, dry etching is performed using a gas such as $NF_3$ or $SF_6$.

FIG. 8B shows a step in which a passivation layer 124 which also serves as an anti-reflection layer is formed over the supporting substrate 101 over which the first unit cell 104 and the second unit cell 105 are formed. The passivation layer 124 is formed of silicon nitride, silicon nitride oxide, or magnesium fluoride. For contact with auxiliary electrodes, openings are formed in the passivation layer 124 so that parts of the surfaces of the first electrode 103 and the second electrode 112 are exposed. The openings of the passivation layer 124 are formed by an etching process. Alternatively, the passivation layer 124 provided with openings is formed. In that case, a method using a shadow mask described above, or a method using a lift off method can be employed.

FIG. 8C shows a step in which the first auxiliary electrode 113 which is in contact with the first electrode 103 and the second auxiliary electrode 114 which is in contact with the second electrode 112 are formed. As shown in FIG. 1, the second auxiliary electrode 114 is a comb-shaped or lattice-shaped electrode. The first auxiliary electrode 113 and the second auxiliary electrode 114 may be formed of aluminum, silver, lead-tin (solder), or the like. For example, the first auxiliary electrode 113 and the second auxiliary electrode 114 are formed by a screen printing method using a silver paste.

Through the above-described steps, the photoelectric conversion device can be manufactured. According to the steps in this embodiment mode, by the technique which bonds different materials, a photoelectric conversion device can be manufactured which includes a bottom cell including a single crystal semiconductor layer with a thickness of 10 μm or less as a photoelectric conversion layer and a top cell, which is stacked over the bottom cell, including a non-single-crystal semiconductor layer as a photoelectric conversion layer at a process temperature of 700° C. or lower (preferably lower than or equal to 500° C.). That is, the photoelectric conversion device, which includes the bottom cell including the single crystal semiconductor layer as a photoelectric conversion layer and the top cell including the non-single-crystal semiconductor layer as a photoelectric conversion layer, which is stacked over the bottom cell, can be manufactured over a large-sized glass substrate having an allowable temperature limit of 700° C. or lower. The conductive clusters 132 are located between the first unit cell and the second unit cell and form an ohmic contact; thus, an effect of flowing current smoothly between the both unit cells is obtained. The conductive clusters are dispersed to be placed, so that an effect of reducing loss of light which enters the second unit cell from the first unit cell is obtained. The single crystal semiconductor layer is obtained by separation of a surface layer of the single crystal semiconductor substrate. Since the single crystal semiconductor substrate can be reused; thus, resources can be effectively used.

Embodiment Mode 3

In some cases, due to formation of the damaged layer 121, crystal defects remain at the surface of the single crystal semiconductor layer 106 which is exposed by separation of the semiconductor substrate 119 shown in FIG. 6B of Embodiment Mode 2. In that case, the surface part of the single crystal semiconductor layer 106 is preferably removed by etching. For the etching, dry etching or wet etching is performed. Further, in some cases, an uneven surface whose mean surface roughness (Ra) is 7 nm to 10 nm and whose largest difference in height between peak and valley (P-V) is 300 nm to 400 nm remains. Note that the "largest difference in height between peak and valley" in this specification refers to a difference in height between the peak and valley. The "peak" and the "valley" in this embodiment refer to a peak and a valley obtained by three-dimensional expansion of the "peak" and the "valley" defined by JIS B0101. The peak is represented by the highest part of the peaks of the specified surface. The valley is represented by the lowest part of the valleys of the specified surface.

Figure 9:
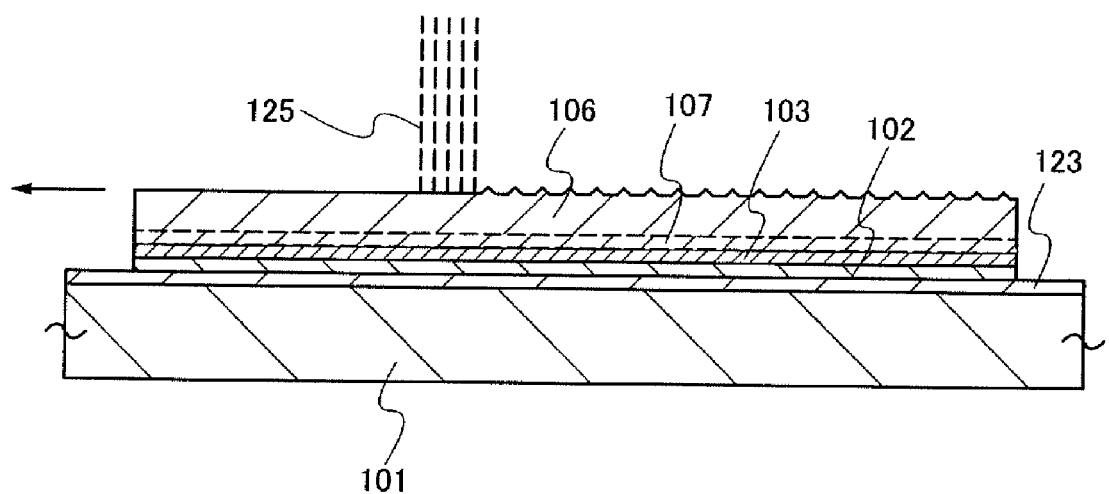
FIG. 9 is a cross-sectional view illustrating a manufacturing step of a stack photoelectric conversion device.

Furthermore, in order to repair the single crystal semiconductor layer 106 in which crystal defects remain, laser treatment is preferably performed. FIG. 9 shows the laser treatment performed on the single crystal semiconductor layer 106. The single crystal semiconductor layer 106 is irradiated with a laser beam 125, so that at least the surface side of the single crystal semiconductor layer 106 is melted and is recrystallized in a later cooling step, using a lower layer part in a solid phase state as seed crystals. In the step, defects of the single crystal semiconductor layer 106 can be repaired. Furthermore, the surface of the single crystal semiconductor layer 106 can be planarized by laser treatment performed in an inert gas atmosphere.

In this laser treatment, it is preferable that a region to be irradiated with a laser beam be at least heated at 250° C. to 600° C. By heating of the region to be irradiated in advance, the melting time due to laser beam irradiation can be lengthened, and defects can be repaired more effectively. Although the laser beam 125 melts the surface side of the single crystal semiconductor layer 106, the supporting substrate 101 is hardly heated; thus, a supporting substrate whose allowable temperature limit is low, such as a glass substrate, can be used. In addition, since the first electrode 103 is formed of heat-resistant metal, the single crystal semiconductor layer 106 is not adversely affected even if heating at the above-described temperature is performed. Silicide is formed at an interface between the first electrode 103 and the first impurity semiconductor layer 107, so that current flows more smoothly.

This laser treatment may be performed after the second impurity semiconductor layer 108 shown in FIG. 7A is formed. Accordingly, activation of the second impurity semiconductor layer 108 can also be performed. Alternatively, this heat treatment may be performed after the conductive clusters 132 shown in FIG. 7B are provided. By reaction between the conductive clusters 132 and the second impurity semiconductor layer 108, a more favorable ohmic contact can be formed.

Figure 11:
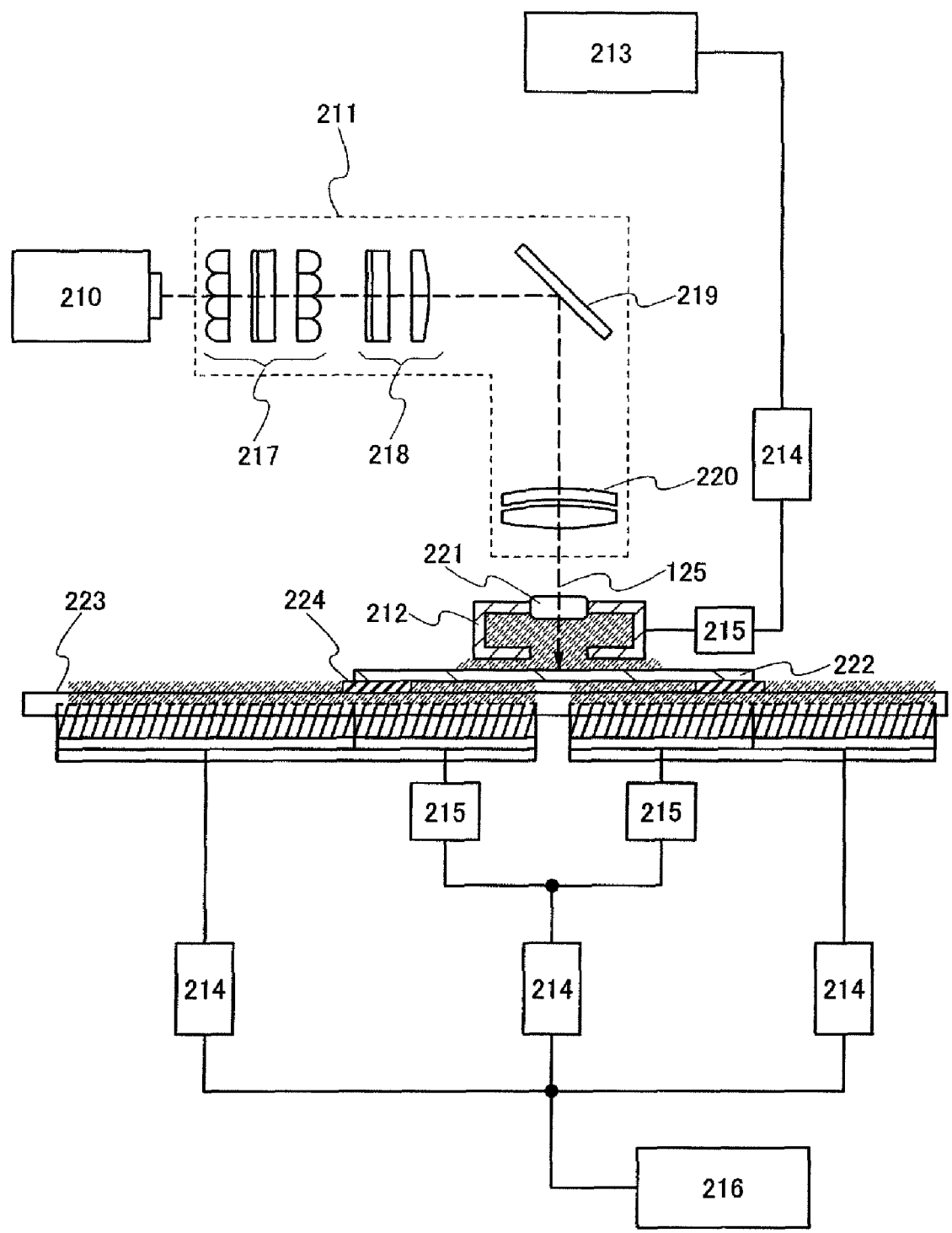
FIG. 11 is a conceptual diagram illustrating a structure of a laser treatment apparatus.

An example of a laser treatment apparatus which can perform this laser process will be described with reference to FIG. 11. The laser treatment apparatus is provided with a laser oscillator 210, an optical system 211 which condenses and extends laser light into a thin linear beam, a gas jetting pipe 212 which controls the atmosphere of a region to be irradiated with a laser, a gas supply portion 213 which supplies a gas for controlling the atmosphere to the gas jetting pipe 212, a flow rate control portion 214, a gas heating portion 215, a substrate stage 222 which floats and carries the supporting substrate 101, a guide rail 223 which carries the substrate while supporting both ends of the substrate, and a gas supply portion 216 which supplies a gas for floating to the substrate stage 222.

As the laser oscillator 210, an oscillator which oscillates light with a wavelength in a range from ultra violet to visible light is selected. The laser oscillator preferably oscillates a pulsed ArF, KrF, or XeCl excimer laser, or a solid-state laser such as an Nd-YAG laser or YLF laser, whose repetition rate is less than or equal to 1 MHz and pulse width is greater than or equal to 10 nsec and less than or equal to 500 nsec. As a laser, a XeCl excimer laser with a repetition rate of 10 Hz to 300 Hz, a pulse width of 25 nanoseconds, and a wavelength of 308 nm can be used, for example.

The optical system 211 condenses and extends laser light to form a laser beam with which a portion is irradiated has a linear shape in cross section. The optical system 211 which forms a linear beam includes a cylinder lens array 217, a cylinder lens 218, a mirror 219, and a tablet cylinder lens 220. The linear laser light of approximately 100 mm to 700 mm in a longer direction and approximately 100 μm to 500 μm in a shorter direction can be emitted although it depends on the size of the lens.

The supporting substrate 101 is irradiated with the laser beam condensed into a linear shape through a light introduce window 221 of the gas jetting pipe 212. The gas jetting pipe 212 is provided in vicinity to the supporting substrate 101. A nitrogen gas is supplied to the gas jetting pipe 212 from the gas supply portion 213. The nitrogen gas is jetted from an opening portion of the gas jetting pipe 212, which faces the supporting substrate 101. The opening portion of the gas jetting pipe 212 is provided in accordance with an optical axis of the linear laser beam so that the supporting substrate 101 is irradiated with the laser beam which enters from the light introduce window 221. Due to the nitrogen gas jetted from the opening portion of the gas jetting pipe 212, a region to be irradiated with the laser beam comes to have a nitrogen atmosphere.

The temperature of a surface of the supporting substrate 101, which is to be irradiated with the laser beam, can be controlled with the nitrogen gas which is supplied to the gas jetting pipe 212 and heated up to 250° C. to 600° C. in the gas heating portion 215. By heating of the region to be irradiated in advance, melting time due to the laser beam irradiation can be controlled as described above.

Air or nitrogen is supplied to the substrate stage 222 from the gas supply portion 216 through the flow rate control portion 214. A gas supplied from the gas supply portion 216 is jetted so that a bottom surface of the supporting substrate 101 is sprayed with the gas from a top surface of a substrate stage 222 to float the supporting substrate 101. The supporting substrate 101 is carried with its both ends mounted on a slider 224 which moves on the guide rail 223. Since the supporting substrate 101 is sprayed with a gas from the substrate stage 222 side, the supporting substrate 101 can be carried without being curved while it is floated. In the laser treatment apparatus of this embodiment mode, a nitrogen gas is jetted from the gas jetting pipe 212 to a top surface of the supporting substrate 101. The supporting substrate 101 can be prevented from being bent by spraying of a gas also from a back surface of the supporting substrate 101.

The substrate stage 222 may be divided into the vicinity of a laser irradiation portion and the other region. The vicinity of the laser irradiation portion of the substrate stage 222 may be sprayed with a nitrogen gas heated by the gas heating portion 215, so that the supporting substrate 101 can be heated.

The laser treatment shown in FIG. 9 is effective in terms of repairing defects of the single crystal semiconductor layer 106. That is, in a photoelectric conversion device, carriers (electrons and holes) generated in a semiconductor by photoelectric conversion are collected in an electrode formed over a surface of a semiconductor layer and extracted as current. At this time, if the number of recombination centers at the surface of the semiconductor layer is large, photogenerated carriers are eliminated there, which becomes a cause of deteriorating photoelectric conversion characteristics. Thus, repairing defects of the single crystal semiconductor layer by laser treatment is effective.

Embodiment Mode 4

Figure 12A:
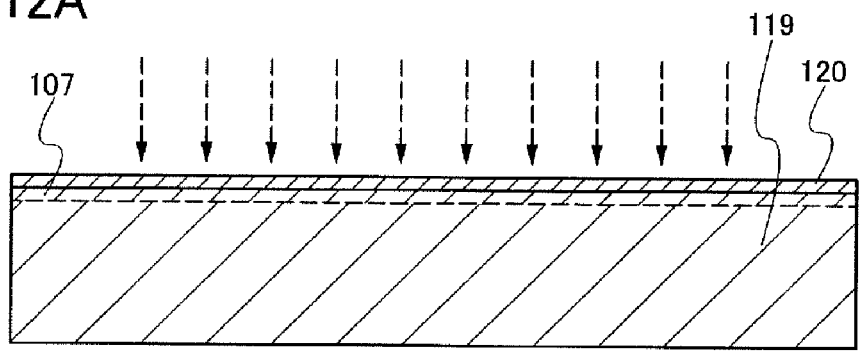
FIGS. 12A to 12C are cross-sectional views illustrating manufacturing steps of a stack photoelectric conversion device.
Figure 12B:
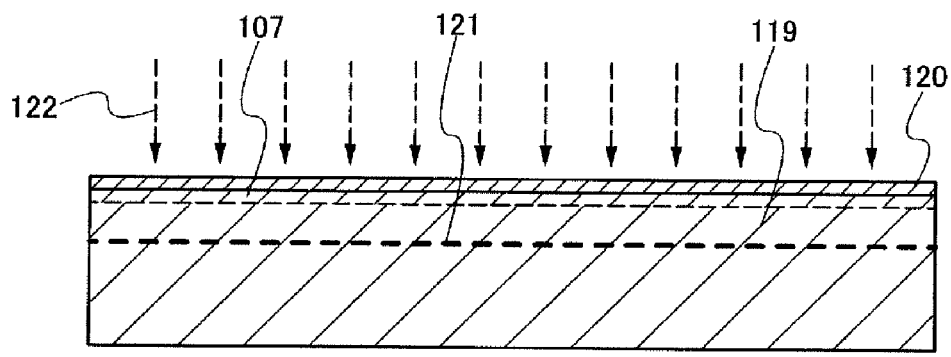
Figure 12C:
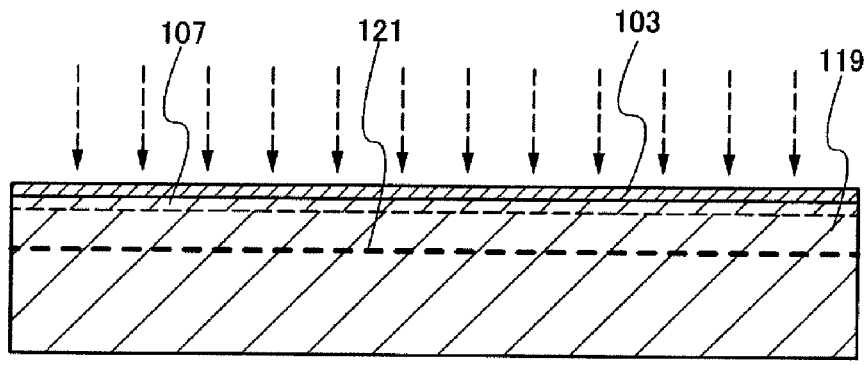

In this embodiment mode, manufacturing steps which are different from those in Embodiment Mode 1 will be described with reference to FIGS. 12A to 12C. After the protective film 120 and the first impurity semiconductor layer 107 are formed (FIG. 12A), the damaged layer 121 may be formed with the protective film 120 left (FIG. 12B). After that, the protective film 120 is removed and the first electrode 103 is formed (FIG. 12C). Such steps make it possible to effectively use the protective film 120. That is, by removal of the protective film 120 damaged due to the irradiation with ions before the first electrode 103 is formed, the surface of the semiconductor substrate 119 can be prevented from being damaged. Moreover, by formation of the damaged layer 121 into which cluster ions of hydrogen are added through the first impurity semiconductor layer 107, hydrogenation of the first impurity semiconductor layer 107 can also be performed. Subsequent steps may be performed in a similar manner to Embodiment Mode 1.

Embodiment Mode 5

Figure 13A:
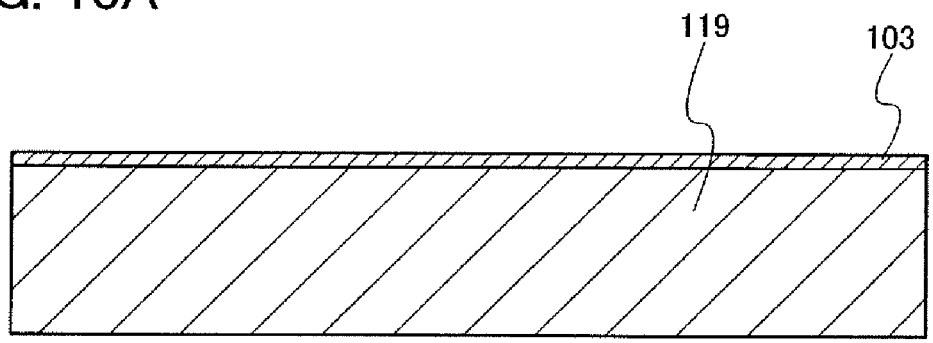
FIGS. 13A to 13C are cross-sectional views illustrating manufacturing steps of a stack photoelectric conversion device.
Figure 13B:
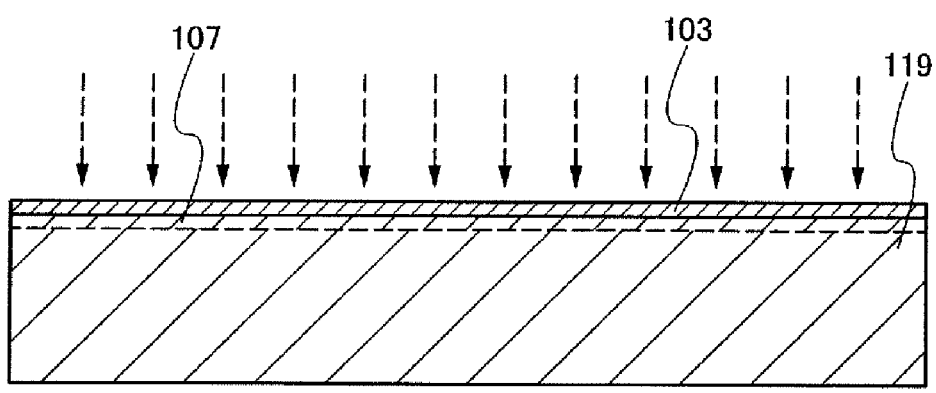
Figure 13C:
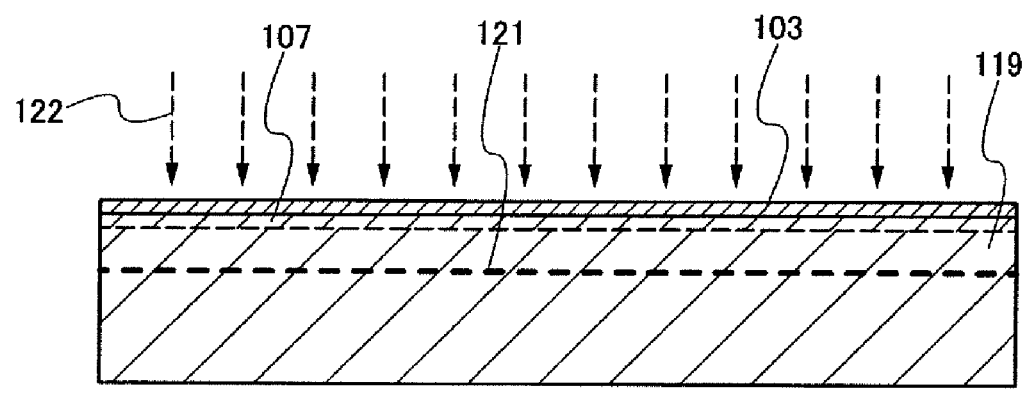

In this embodiment mode, manufacturing steps which are different from those in Embodiment Mode 1 will be described with reference to FIGS. 13A to 13C. The first electrode 103 is formed over the semiconductor substrate 119 (FIG. 13A), and an impurity imparting one conductivity type is added through the first electrode 103 to form the first impurity semiconductor layer 107 (FIG. 13B). Then, cluster ions of hydrogen are added through the first electrode 103 to form the damaged layer 121 (FIG. 13C). In this step, the first electrode 103 formed in advance can be used as a layer preventing damage due to ion doping. Moreover, a step of forming a protective film for ion doping can be omitted. Subsequent steps may be performed in a similar manner to Embodiment Mode 1.

Embodiment Mode 6

Figure 14A:
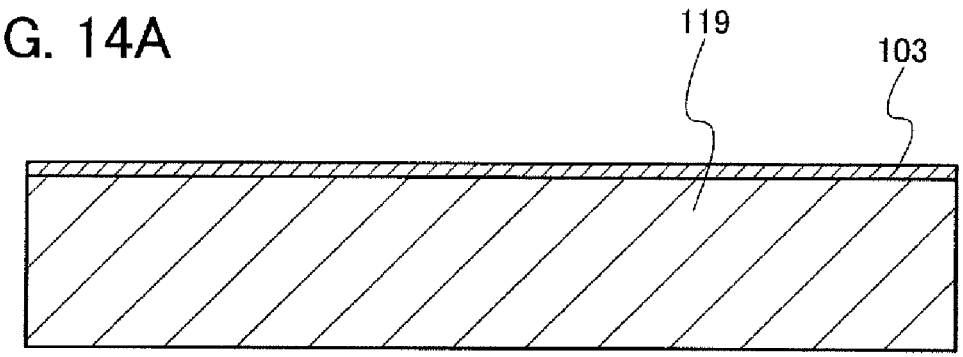
FIGS. 14A to 14C are cross-sectional views illustrating manufacturing steps of a stack photoelectric conversion device.
Figure 14B:
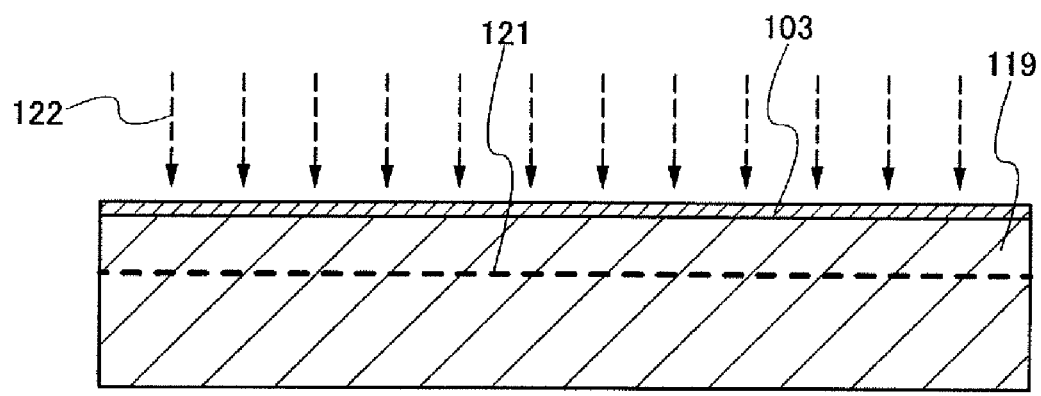
Figure 14C:
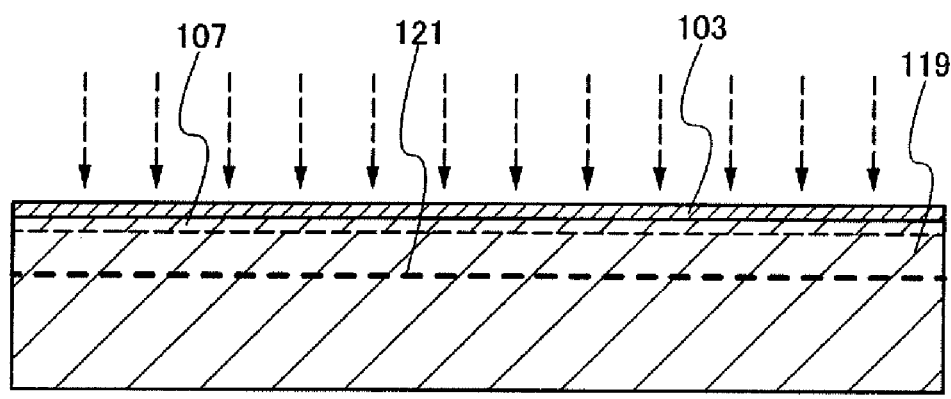

In this embodiment mode, manufacturing steps which are different from those in Embodiment Mode 1 will be described with reference to FIGS. 14A to 14C. The first electrode 103 is formed over the semiconductor substrate 119 (FIG. 14A), and cluster ions of hydrogen are added through the first electrode 103 to form the damaged layer 121 (FIG. 14B). Then, an impurity imparting one conductivity type is added through the first electrode 103 to form the first impurity semiconductor layer 107 (FIG. 14C). In this step, the first electrode 103 formed in advance can be used as a layer preventing damage due to ion doping. In this embodiment mode, a step of forming a protective film for ion doping can be omitted. Moreover, by formation of the damaged layer 121 into which cluster ions of hydrogen are added through the first impurity semiconductor layer 107, hydrogenation of the first impurity semiconductor layer 107 can also be formed. Subsequent steps may be performed in a similar manner to Embodiment Mode 1.

Embodiment Mode 7

Figure 15A:
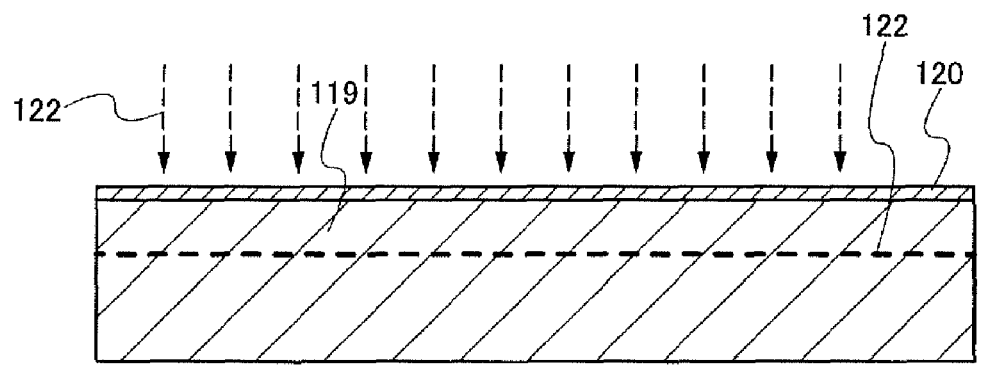
FIGS. 15A to 15C are cross-sectional views illustrating manufacturing steps of a stack photoelectric conversion device.
Figure 15B:
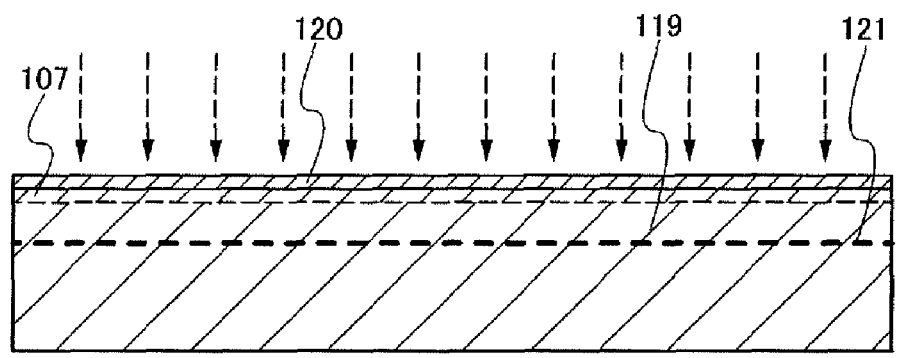
Figure 15C:
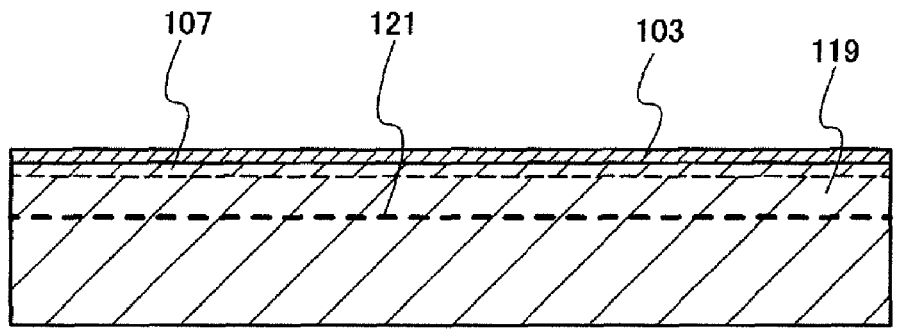

In this embodiment mode, manufacturing steps which are different from those in Embodiment Mode 1 will be described with reference to FIGS. 15A to 15C. The protective film 120 is formed, and cluster ions of hydrogen are added to form the damaged layer 121 (FIG. 15A), and the first impurity semiconductor layer 107 is formed with the protective film 120 left (FIG. 15B). Then, the protective film 120 is removed and the first electrode 103 is formed (FIG. 15C). Such steps make it possible to effectively use the protective film 120. Moreover, by formation of the first impurity semiconductor layer 107 after formation of the damaged layer 121, the impurity concentration of the first impurity semiconductor layer 107 can be increased and a shallow junction can be formed. Accordingly, a photoelectric conversion device which has high collection efficiency of photogenerated carriers by back surface field (BSF) effect can be manufactured. Subsequent steps may be performed in a similar manner to Embodiment Mode 1.

Embodiment Mode 8

Figure 16A:
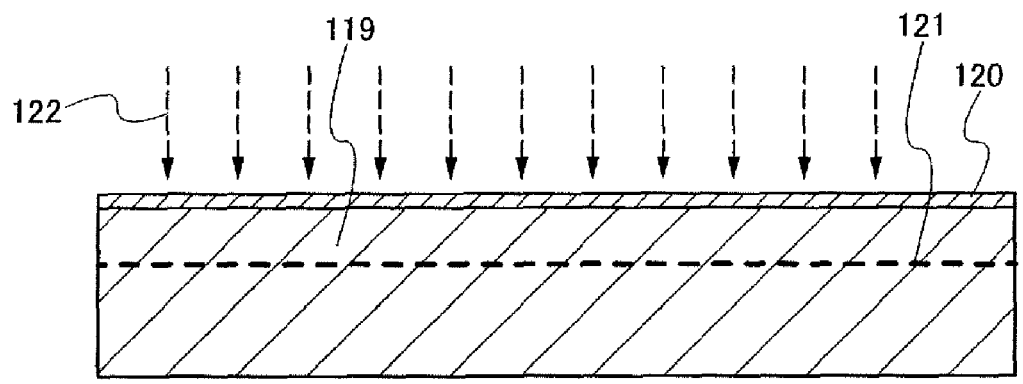
FIGS. 16A to 16C are cross-sectional views illustrating manufacturing steps of a stack photoelectric conversion device.
Figure 16B:
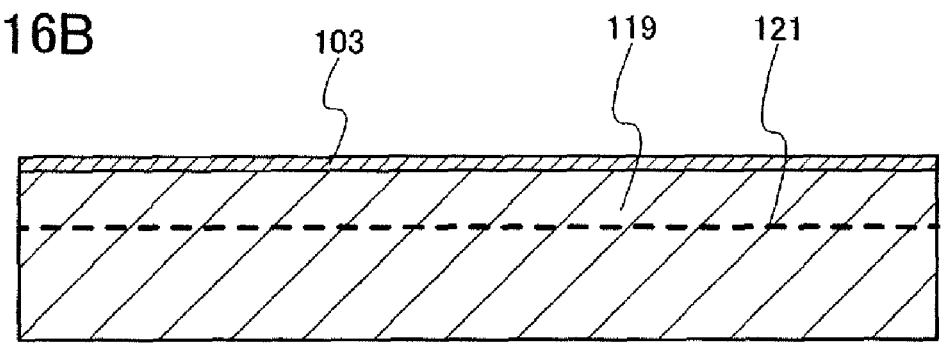
Figure 16C:
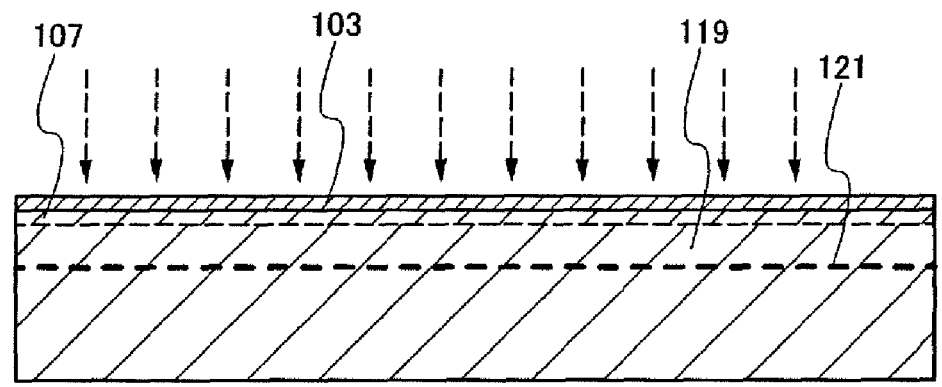

In this embodiment mode, manufacturing steps which are different from those in Embodiment Mode 1 will be described with reference to FIGS. 16A to 16C. The protective film 120 is formed, and cluster ions of hydrogen are added to form the damaged layer 121 (FIG. 16A), and the protective film 120 is removed and the first electrode 103 is formed (FIG. 16B). Then, an impurity imparting one conductivity type is added through the first electrode 103 to form the first impurity semiconductor layer 107 (FIG. 16C). By formation of the first impurity semiconductor layer 107 through the first electrode 103, the thickness of the first impurity semiconductor layer 107 can be easily controlled. Subsequent steps may be performed in a similar manner to Embodiment Mode 1.

Embodiment Mode 9

Figure 17A:
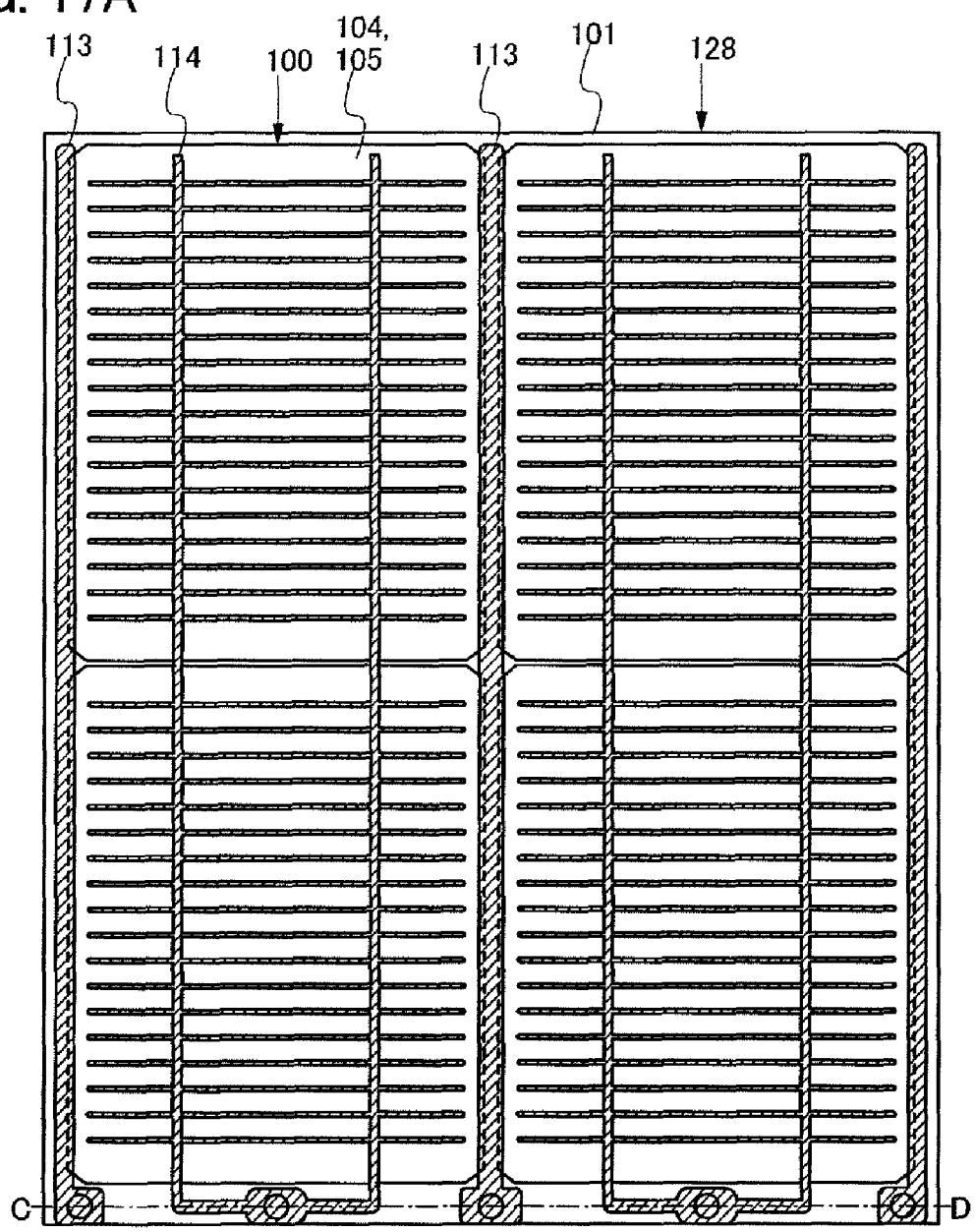
FIG. 17A is a plan view illustrating a structure of a photovoltaic module and FIG. 17B is a cross-sectional view taken along a line C-D of FIG. 17A.

An example of a photovoltaic module using the photoelectric conversion device manufactured according to Embodiment Modes 1 to 8 is shown in FIG. 17A. This photovoltaic module 128 includes the first unit cell 104 and the second unit cell 105 provided over the supporting substrate 101.

Figure 17B:
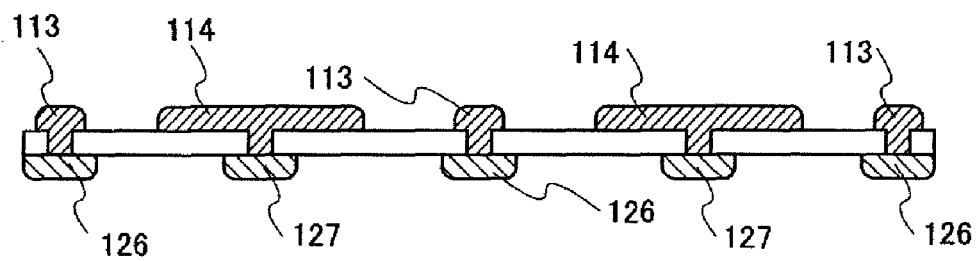

The first auxiliary electrode 113 and the second auxiliary electrode 114 are formed over one surface of the supporting substrate 101, and the first auxiliary electrode 113 and the second auxiliary electrode 114 are connected to a first rear electrode 126 and a second rear electrode 127 respectively at edge regions of the supporting substrate 101. FIG. 17B is a cross-sectional view taken along a line C-D of FIG. 17A. The first auxiliary electrode 113 is connected to the rear electrode 126 and the second auxiliary electrode 114 is connected to the second rear electrode 127 through penetrating openings of the supporting substrate 101.

The photoelectric conversion device 100 is manufactured in which the first supporting substrate 101 is provided with the first unit cell 104 and the second unit cell 105 as described above, whereby reduction in thickness of the photovoltaic module 128 can be achieved.

Embodiment Mode 10

Figure 18:
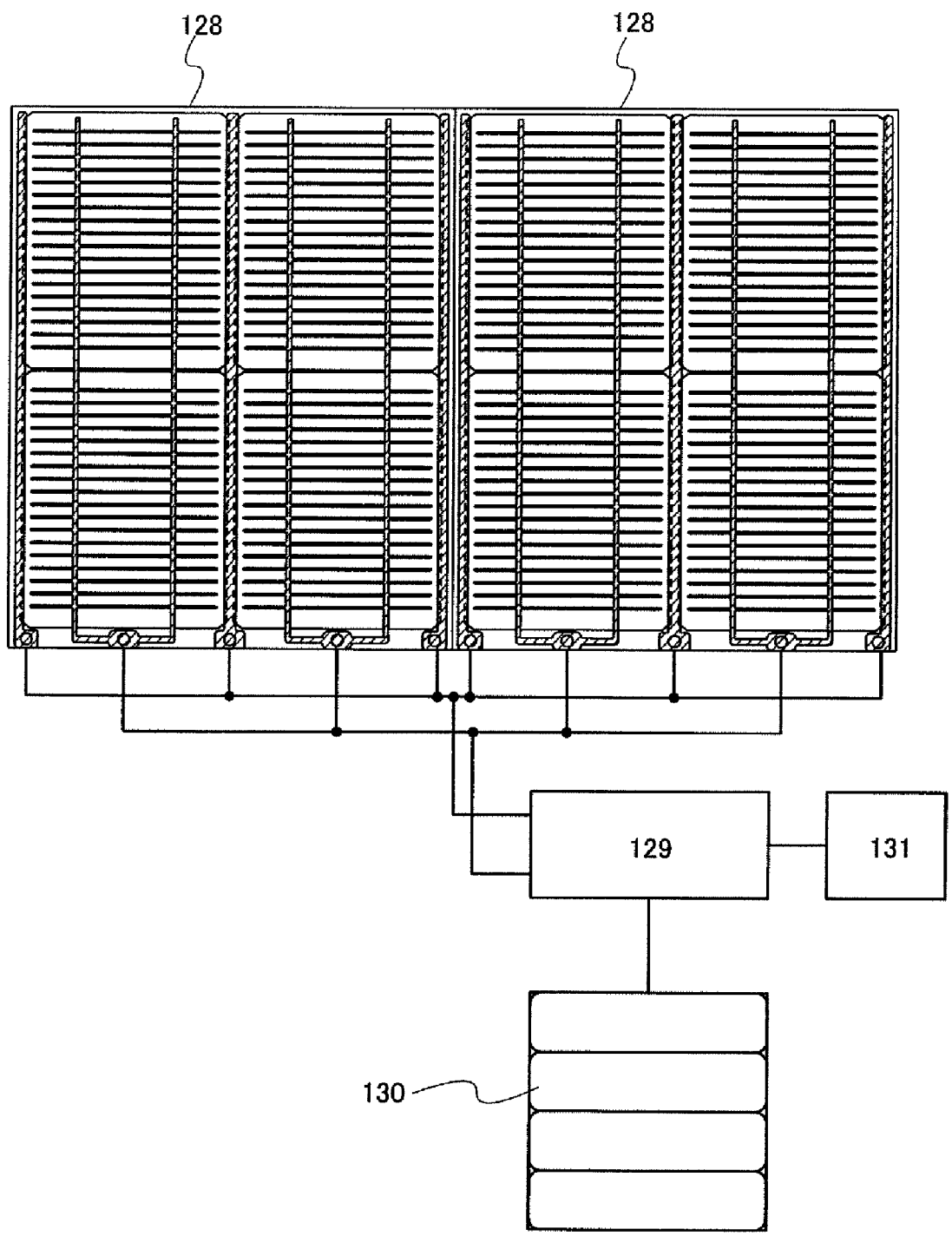
FIG. 18 is a diagram illustrating an example of a photovoltaic system.

FIG. 18 shows an example of a photovoltaic system using the photovoltaic module 128. Output power of one or a plurality of photovoltaic modules 128 charges a rechargeable battery 130 with a charge control circuit 129. In the case where the charge amount of the rechargeable battery 130 is large, the output power is directly outputted to a load 131 in some cases.

When an electric-double layer capacitor is used for the rechargeable battery 130, a chemical reaction is not needed for charging, and thus charging can be performed rapidly. Moreover, the lifetime of the rechargeable battery 130 can be increased by about 8 times and the charge-discharge efficiency thereof can be increased by 1.5 times in comparison with a lead battery or the like which uses a chemical reaction. The load 131 can be used for various purposes such as lighting such as a fluorescent lamp, a light-emitting diode, or an electroluminescent panel, and a small-sized electronic device.

This application is based on Japanese Patent Application serial No. 2007-298325 filed with Japan Patent Office on Nov. 16, 2007, the entire contents of which are hereby incorporated by reference.

What is claimed is:

1. A photoelectric conversion device comprising:
   an insulating layer formed over a supporting substrate; and
   a first unit cell and a second unit cell formed over the insulating layer,
   wherein the first unit cell includes at least a first electrode, a single crystal semiconductor layer, a first impurity semiconductor layer having one conductivity type, and a second impurity semiconductor layer having an opposite conductivity type to the one conductivity type,
   wherein the second unit cell includes at least a second electrode, a non-single-crystal semiconductor layer, a third impurity semiconductor layer having one conductivity type, and a fourth impurity semiconductor layer having an opposite conductivity type to the one conductivity type,
   wherein the single crystal semiconductor layer is formed between the first impurity semiconductor layer and the second impurity semiconductor layer,
   wherein the single crystal semiconductor layer is formed over the first electrode with the first impurity semiconductor layer interposed therebetween,
   wherein the non-single-crystal semiconductor layer is formed between the third impurity semiconductor layer and the fourth impurity semiconductor layer,
   wherein the second electrode is formed over the non-single-crystal semiconductor layer with the fourth impurity semiconductor layer interposed therebetween, and
   wherein conductive clusters formed of metal, metal nitride, or metal oxide are included at a bonding interface between the second impurity semiconductor layer and the third impurity semiconductor layer.

2. The photoelectric conversion device according to claim 1, wherein a thickness of the single crystal semiconductor layer is greater than or equal to 0.1 μm and less than or equal to 10 μm.

3. The photoelectric conversion device according to claim 1, wherein the single crystal semiconductor layer is single crystal silicon and the non-single-crystal semiconductor layer is amorphous silicon.

4. The photoelectric conversion device according to claim 1, wherein the first electrode is a metal material selected from titanium, molybdenum, tungsten, tantalum, chromium, and nickel.

5. The photoelectric conversion device according to claim 1, wherein the first electrode includes a nitride layer of a metal material selected from titanium, molybdenum, tungsten, tantalum, chromium, and nickel, and
   wherein the nitride layer is in contact with the first impurity semiconductor layer.

6. The photoelectric conversion device according to claim 1, wherein the insulating layer is any one of a silicon oxide layer, a silicon oxynitride layer, a silicon nitride oxide layer, or a silicon nitride layer.

7. The photoelectric conversion device according to claim 1, wherein the supporting substrate is a glass substrate.

8. The photoelectric conversion device according to claim 1, wherein the conductive clusters are a metal compound or an alloy containing one or a plurality of elements selected from titanium, chromium, cobalt, nickel, and molybdenum, or nitride or oxide containing the metal.

9. A photoelectric conversion device comprising:
   an insulating layer formed over a supporting substrate;
   a first electrode formed over the insulating layer;
   a first impurity semiconductor layer formed over the first electrode;
   a single crystal semiconductor layer formed over the first impurity semiconductor layer;
   a second impurity semiconductor layer formed over the single crystal semiconductor layer;
   conductive clusters formed over the second impurity semiconductor layer;
   a third impurity semiconductor layer formed over the conductive clusters;
   a non-single-crystal semiconductor layer formed over the third impurity semiconductor layer;
   a fourth impurity semiconductor layer formed over the non-single-crystal semiconductor layer; and
   a second electrode formed over the fourth impurity semiconductor layer,
   wherein the conductive clusters formed of metal, metal nitride, or metal oxide are included at a bonding interface between the second impurity semiconductor layer and the third impurity semiconductor layer.

10. The photoelectric conversion device according to claim 9, wherein a thickness of the single crystal semiconductor layer is greater than or equal to 0.1 μm and less than or equal to 10 μm.

11. The photoelectric conversion device according to claim 9, wherein the single crystal semiconductor layer is single crystal silicon and the non-single-crystal semiconductor layer is amorphous silicon.

12. A photoelectric conversion device comprising:
   an insulating layer formed over a supporting substrate;
   a first electrode formed over the insulating layer;
   a first impurity semiconductor layer formed over the first electrode;
   a single crystal semiconductor layer formed over the first impurity semiconductor layer;
   a second impurity semiconductor layer formed over the single crystal semiconductor layer;
   first conductive clusters formed over the second impurity semiconductor layer;
   a third impurity semiconductor layer formed over the first conductive clusters;
   a first non-single-crystal semiconductor layer formed over the third impurity semiconductor layer;
   a fourth impurity semiconductor layer formed over the non-single-crystal semiconductor layer; and
   second conductive clusters formed over the fourth impurity semiconductor layer;
   a fifth impurity semiconductor layer formed over the second conductive clusters;
   a second non-single-crystal semiconductor layer formed over the fifth impurity semiconductor layer;
   a sixth impurity semiconductor layer formed over the second non-single-crystal semiconductor layer; and a second electrode formed over the sixth impurity semiconductor layer, wherein the first conductive clusters formed of metal, metal nitride, or metal oxide are included at a bonding interface between the second impurity semiconductor layer and the third impurity semiconductor layer, and wherein the second conductive clusters formed of metal, metal nitride, or metal oxide are included at a bonding interface between the fourth impurity semiconductor layer and the fifth impurity semiconductor layer.

13. The photoelectric conversion device according to claim 12, wherein a thickness of the single crystal semiconductor layer is greater than or equal to 0.1 μm and less than or equal to 10 μm.

14. The photoelectric conversion device according to claim 12, wherein the single crystal semiconductor layer is single crystal silicon and the first and second non-single-crystal semiconductor layers are amorphous silicon.

* * * * *